(12) United States Patent  
Gormley et al.

(10) Patent No.: US 7,703,658 B2  
(45) Date of Patent: Apr. 27, 2010

(54) APPARATUS AND METHOD FOR SEMICONDUCTOR WAFER BUMPING VIA INJECTION MOLDED SOLDER

(75) Inventors: G. Gerard Gormley, Worcester, VT (US); Patrick Gorun, Burlington, VT (US); Michael Davidson, Wolcott, VT (US)

(73) Assignee: Suss Microtec AG, Garching/Munich (DE)

( * ) Notice: Subject to any disclaimer, the term of this patent is extended or adjusted under 35 U.S.C. 154(b) by 79 days.

(21) Appl. No.: 12/056,369

(22) Filed: Mar. 27, 2008

(65) Prior Publication Data

US 2008/0237315 A1 Oct. 2, 2008

Related U.S. Application Data

(60) Provisional application No. 60/908,737, filed on Mar. 29, 2007.

(51) Int. Cl.
*B23K 37/06* (2006.01)
*B23K 3/06* (2006.01)

(52) U.S. Cl. .............. 228/33; 228/43; 228/180.22; 228/256

(58) Field of Classification Search .............. 228/8, 228/11, 46, 180.22, 256, 33–43; 164/303, 164/306, 408; 425/542; 118/410; 222/590–607
See application file for complete search history.

(56) References Cited

U.S. PATENT DOCUMENTS

| | | | | |
|---|---|---|---|---|
| 5,971,058 A | * | 10/1999 | Bolde et al. | 164/130 |
| 6,003,757 A | | 12/1999 | Beaumont et al. | |
| 6,015,081 A | * | 1/2000 | Okabayashi et al. | 228/180.22 |
| 6,056,191 A | * | 5/2000 | Brouillette et al. | 228/254 |
| 6,063,196 A | * | 5/2000 | Li et al. | 118/712 |
| 6,231,333 B1 | * | 5/2001 | Gruber et al. | 425/546 |
| 6,527,158 B1 | | 3/2003 | Brouillette et al. | |
| 6,566,612 B2 | | 5/2003 | Brouillette et al. | |
| 6,700,068 B2 | | 3/2004 | Hoffmeyer et al. | |

(Continued)

OTHER PUBLICATIONS

Laine et al., C4NP as a high-volume manufacturing method for fine-pitch and lead-free flip chip solder bumping, Electronics Systemintegration Technology Conference, 2006. 1st, Sep. 5-7, 2006, pp. 518-524.*

(Continued)

*Primary Examiner*—Jessica L. Ward
*Assistant Examiner*—Kevin E Yoon
(74) *Attorney, Agent, or Firm*—AKC Patents LLC; Aliki K. Collins

(57) ABSTRACT

An improved apparatus for filling patterned mold cavities formed on a surface of a mold structure with solder includes an injector head assembly comprising a solder reservoir having a bottom surface with an elongated slot for injecting solder into the mold cavities and a carriage assembly configured to carry and scan the mold structure under the injector head assembly. The mold structure is brought into contact with the solder reservoir bottom surface and a seal is formed between an area of the solder reservoir bottom surface surrounding the elongated slot and the mold structure surface and then the mold structure is scanned under the injector head assembly in a first direction from a starting position to a finish position for filling the mold cavities and in a second direction opposite to the first direction for returning back from the finish position to the starting position.

19 Claims, 38 Drawing Sheets

U.S. PATENT DOCUMENTS

| | | | |
|---|---|---|---|
| 7,121,448 B2 * | 10/2006 | Subramanian et al. | 228/2.1 |
| 2005/0015962 A1 | 1/2005 | Sturm, Jr. et al. | |
| 2005/0263571 A1 * | 12/2005 | Belanger et al. | 228/256 |
| 2006/0290034 A1 | 12/2006 | Sideris | |
| 2007/0246515 A1 * | 10/2007 | Cordes et al. | 228/180.22 |
| 2007/0246853 A1 | 10/2007 | Chey et al. | |
| 2008/0006202 A1 | 1/2008 | Hirano et al. | |
| 2008/0048008 A1 * | 2/2008 | Schultz | 228/180.22 |

OTHER PUBLICATIONS

Gruber et al. Low-cost Wafer Bumping, IBM Journal of Research and Development, Jul./Sep. 2005, vol. 49 No. 4/5, p. 621-639.

* cited by examiner

Cleaner assembly

APPARATUS AND METHOD FOR SEMICONDUCTOR WAFER BUMPING VIA INJECTION MOLDED SOLDER

CROSS REFERENCE TO RELATED CO-PENDING APPLICATIONS

This application claims the benefit of U.S. provisional application Ser. No. 60/908,737 filed Mar. 29, 2007 and entitled "APPARATUS AND METHOD FOR SEMICONDUCTOR WAFER BUMPING VIA INJECTION MOLDED SOLDER", the contents of which are expressly incorporated herein by reference.

FIELD OF THE INVENTION

The present invention relates to an apparatus and a method for semiconductor wafer bumping, and more particularly to semiconductor wafer bumping via an injection molded solder process.

BACKGROUND OF THE INVENTION

Injection Molded Solder (IMS) is a process used to produce solder bumps on a semiconductor wafer surface. Referring to FIG. 1, the IMS process 30 includes depositing solder into mold cavities (34), forming a pattern on the semiconductor wafer surface (32), aligning the filled mold cavities with the patterned semiconductor wafer surface and then transferring the solder from the mold cavities to the semiconductor wafer surface (38). Solder bumps are formed in a glass mold plate 82 by injecting molten solder into the etched mold cavities. The etched cavities match the pattern of solder bumps required on the semiconductor wafer surface. The process provides fine pitch placement of the solder bumps in the range of 10 to 500 micrometers separation distance between adjacent solder bumps.

The IMS process has been tested and applied for laboratory scale applications. It is desirable to provide a scale-up process and a high volume manufacturing (HVM) apparatus designed to optimize the high volume manufacturing process. A critical aspect of the scale-up process involves the complete filling of the mold cavities. It is desirable to fill all mold cavities uniformly with solder without leaving some cavities either not filled or partially filled or overfilled.

SUMMARY OF THE INVENTION

In general, in one aspect, the invention features an apparatus for filling patterned mold cavities formed on a surface of a mold structure with solder. The apparatus includes an injector head assembly comprising a solder reservoir having a bottom surface with an elongated slot for injecting solder into the mold cavities and a carriage assembly configured to carry and scan the mold structure under the injector head assembly. The mold structure is brought into contact with the solder reservoir bottom surface and a seal is formed between an area of the solder reservoir bottom surface surrounding the elongated slot and the mold structure surface and then the mold cavities are filled with solder by scanning the mold structure under the injector head in a first direction from a starting position to a finish position while solder is injected into them and then the mold structure with the filled mold cavities is returned back to the starting position by scanning it in a second direction opposite to the first direction without any further solder injection Implementations of this aspect of the invention may include one or more of the following features. The solder reservoir is heated to a temperature above the solder melting point and is slightly pressurized. The apparatus further includes a preheat station where the mold structure is preheated to a temperature slightly below the solder melting temperature prior to the scanning and filling of the mold cavities with solder. The apparatus further includes a cool down station where the mold structure is slowly cooled down to room temperature after the filling of the mold cavities with solder. The apparatus further includes an aligner for aligning the mold structure prior to the scanning and filling of the mold cavities with solder. The injector head assembly remains stationary during the scanning in the first and second directions of the mold structure. The carriage assembly includes first and second parallel rails, a plate assembly movable upon the first and second parallel rails, a start parking space and a finish parking space. The mold structure is placed upon the movable plate assembly for performing the scanning under the injector head assembly. The plate assembly includes a heated plate upon which mold structure is mounted, a non-heated back plate and an insulator plate placed between the heated plate and the back plate. The mold structure is kinematically mounted onto the heated plate via three motorized pins and wherein the three motorized pins are arranged at 120 degree angle relative to each other and are used for lowering and raising the mold structure onto the heated plate. Each of the parking spaces includes a parking plate having a V-groove on its bottom surface, a heated base supporting the parking plate, an insulator plate supporting the heated base, a back plate supporting the insulator plate and first and second leveling plates configured to level the back plate. The heated base and the heated plate upon which the mold structure is mounted are heated to a temperature slightly above the solder melting point. The injector head assembly further includes a hot gas skirt surrounding the solder reservoir bottom surface and being configured to blow hot gas onto it. The injector head assembly further comprises an O-ring surrounding the elongated slot and forming the seal between an area of the solder reservoir bottom surface surrounding the elongated slot and the mold structure surface. The O-ring is made of a material capable of withstanding the solder melt temperature. The apparatus further includes an injector head slide assembly and the injector head assembly is supported and mounted onto the injector head slide assembly via a mounting mechanism that stabilizes the injector head assembly position while allowing for small thermal sidewise expansions, along the direction of the elongated slot. The apparatus further includes a support frame supporting the injector head slide assembly and first and second parking space lifters. The first and second parking space lifters are configured to pick the start and finish parking plates, respectively and raise them up or lower them down onto the corresponding heated bases. The apparatus further includes a parking plate cleaner configured to clean the parking plates. The injector head slide assembly is made of a material with low coefficient of thermal expansion. The apparatus further includes one or more thermocouples inserted into the solder reservoir at various heights and the thermocouples produce thermocouple readings used to measure solder fill levels in the solder reservoir. The injector head assembly may further include capillaries through which air is blown toward the elongated slot for freezing any molten solder.

In general, in another aspect, the invention features an apparatus for forming solder bumps onto semiconductor structures including equipment for filling patterned mold cavities formed on a surface of a mold structure with solder, equipment for positioning and aligning a patterned first surface of a semiconductor structure directly opposite to the solder filled patterned mold cavities of the mold structure, a fixture tool for holding and transferring the aligned mold and semiconductor structures together and equipment for receiving the fixture tool with the aligned mold and semiconductor structures and transferring the solder from the aligned patterned mold cavities to the aligned patterned semiconductor first surface. The mold cavity filling equipment include an injector head assembly comprising a solder reservoir having a bottom surface with an elongated slot for injecting solder into the mold cavities and wherein the mold structure is brought into contact with the solder reservoir bottom surface and the elongated slot and a seal is formed between an area of the solder reservoir bottom surface surrounding the elongated slot and the mold structure surface and then the mold cavities are filled with solder by scanning the mold structure under the injector head in a first direction from a starting position to a finish position while solder is injected into them and then the mold structure with the filled mold cavities is returned back to the starting position by scanning it in a second direction opposite to the first direction without any further solder injection.

In general, in another aspect, the invention features a method for filling patterned mold cavities formed on a first surface of a mold structure with solder including the following steps. First providing an injector head assembly comprising a solder filled reservoir having a bottom surface with an elongated slot for injecting solder through the elongated slot into the mold cavities. Next, providing a carriage assembly configured to carry and scan the mold structure under the injector head assembly and loading the mold structure onto the carriage assembly. Next, bringing the mold structure in contact with the solder reservoir bottom surface and the elongated slot and forming a seal between an area of the solder reservoir bottom surface surrounding the elongated slot and the mold structure surface and then scanning the mold structure under the injector head assembly in a first direction from a starting position to a finish position while injecting molten solder into the mold cavities and then scanning the filled mold structure in a second direction opposite to the first direction, without any further solder injection, for returning the mold structure back from the finish position to the starting position. The scanning step includes the following. First, positioning the injector head assembly upon the heated start parking space and then loading and centering the mold structure onto the plate assembly, so that is in contact with a heated plate. Next, moving the heated finish parking space to a fixed stop and aligning an edge of the finish parking space with an adjacent edge of the mold structure. Next, moving the start parking space with the injector head assembly to a start position and then locking the start and finish parking space positions. Next, scanning the heated plate with the mold structure in the first direction so that the injector head assembly is moved from the start parking space onto the mold structure. Next, cleaning any solder deposits from the start parking plate and lifting the start parking plate from the start parking space with the first parking space lifter. Next, continue scanning the heated plate with the mold structure under the injector head assembly and the lifted start parking plate in the first direction while injecting solder into the mold cavities until all mold cavities are filled with solder. Next, positioning the injector head assembly onto the finish parking space and placing it in contact with the finish parking plate. Next, separating the heated plate with the filled mold structure from the finish parking space. Next, lifting the injector head assembly with the finish parking plate from the finish parking space and placing the cleaned start parking plate onto the finish parking space. Next, scanning the heated plate with the filled mold structure in the second direction under the finish parking plate and injector head assembly until reaching the start parking space. Finally, placing the finish parking plate with the injector head assembly onto the start parking space and unloading the filled mold structure.

The method may further include positioning and aligning a patterned first surface of a semiconductor structure directly opposite to the solder filled patterned mold cavities of the mold structure. Next, providing a fixture tool for holding and transferring the aligned mold and semiconductor structures together. Next, receiving the fixture tool with the aligned mold and semiconductor structures and transferring the solder from the aligned patterned mold cavities to the aligned patterned semiconductor first surface. The mold cavities pattern matches the semiconductor surface pattern.

BRIEF DESCRIPTION OF THE DRAWINGS

Referring to the figures, wherein like numerals represent like parts throughout the several views.

DETAILED DESCRIPTION OF THE INVENTION

Figure 1:
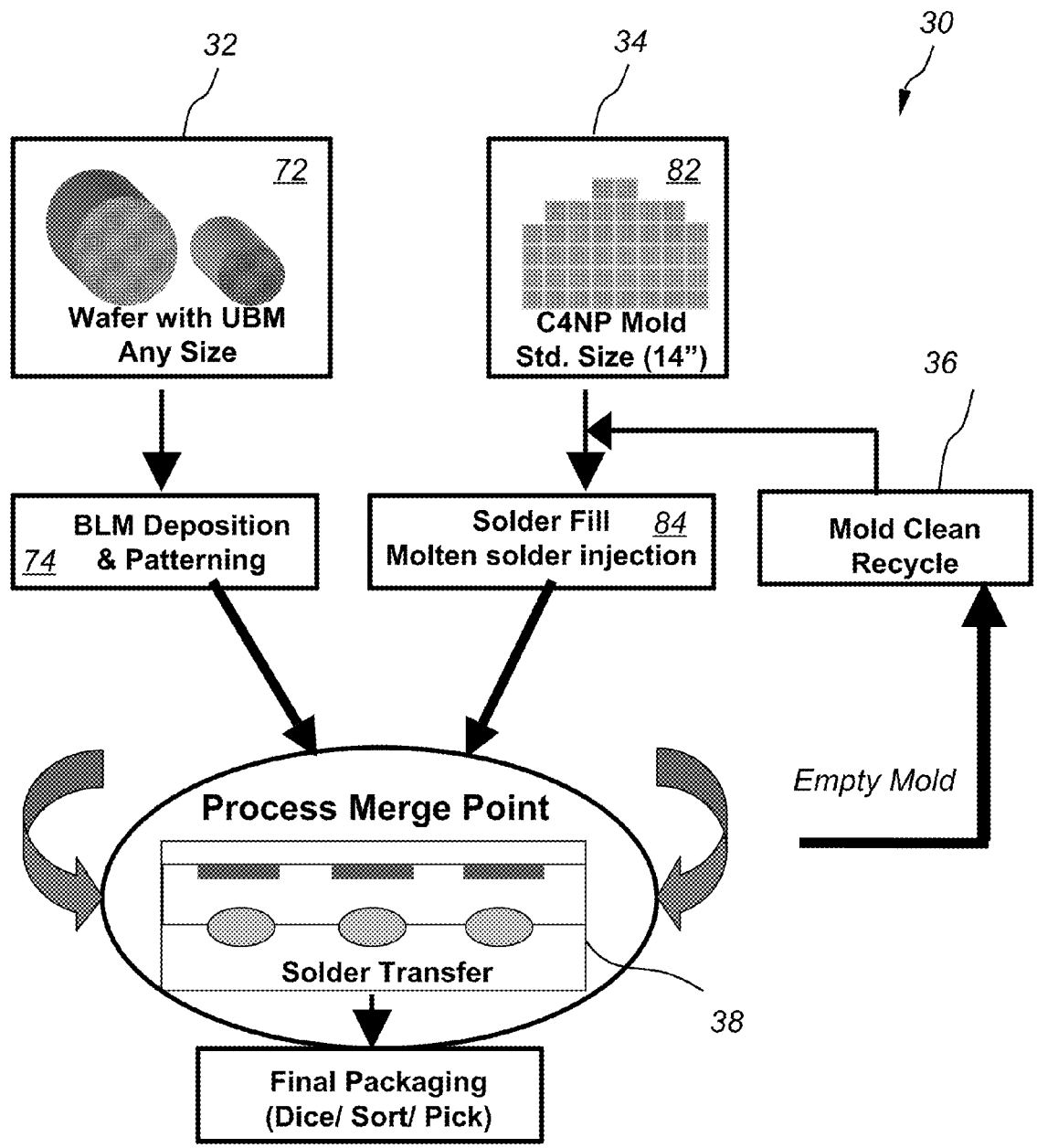
FIG. 1 is a schematic diagram of a laboratory scale Injection Molded Solder (IMS) process.
Figure 2:
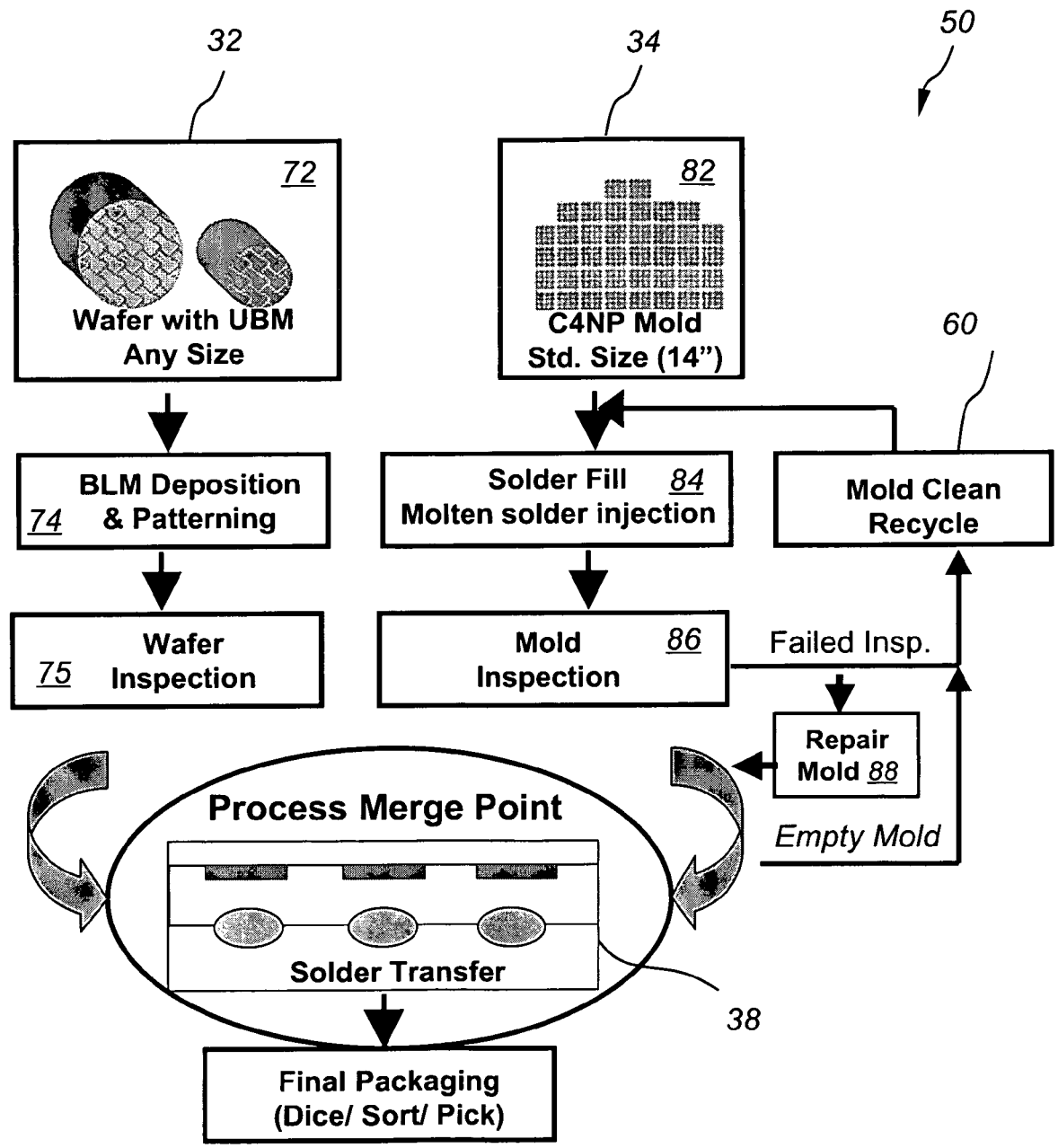
FIG. 2 is a schematic diagram of a scale-up IMS process according to this invention.
Figure 3:
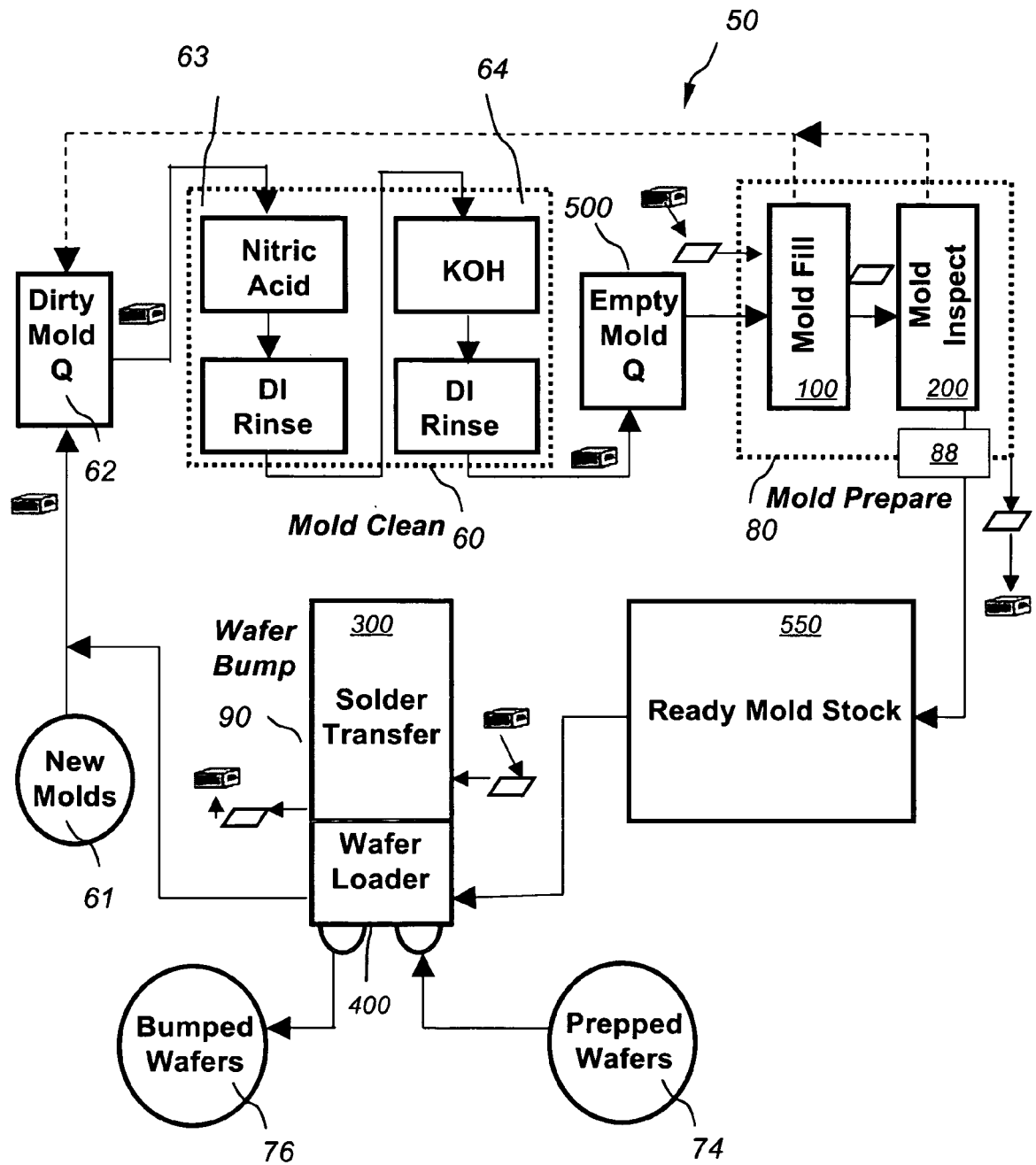
FIG. 3 is a block diagram of the scale-up IMS process flow.
Figure 4:
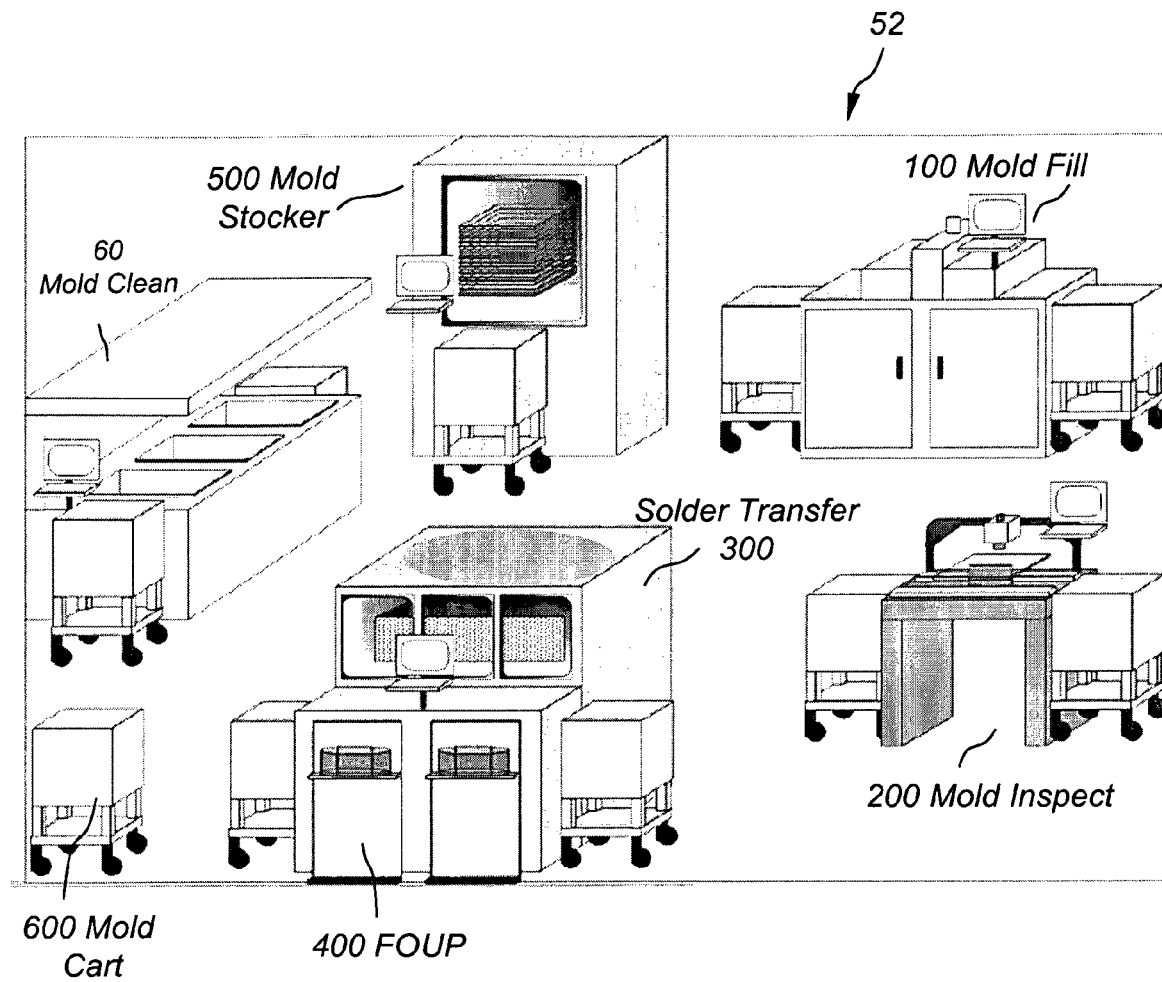
FIG. 4 is a schematic diagram of the HVM IMS equipment system according to this invention.

Referring to FIG. 2, the scale-up IMS process 50 includes filling mold cavities with solder (34), inspecting the filled mold plate (86), forming a pattern on the semiconductor wafer surface (32), inspecting the wafer surface (75) and then transferring the solder from the mold cavities to the semiconductor wafer surface (38). Referring to FIG. 3, the scale-up IMS process 50 further includes cleaning of the molds at a mold clean station 60, filling of the mold cavities with solder and inspecting the filled mold plate at a mold prepare station 80, and transferring of the solder from the mold cavities onto the patterned semiconductor wafer surface at a wafer bump station 90. The mold prepare station 80 includes a mold fill tool (MFT) 100, a mold inspect tool (MIT) 200, and a mold repair tool 88. The wafer bump station 90 includes a solder transfer tool (STT) 300 and a wafer loader tool 400. New molds 61 and previously used molds 62 pass through the mold clean station 60 where they get cleaned with an acid solution 63 and a base solution 64. The clean molds 82 enter a mold stocker 500 and from there they are introduced into the MFT 100. After filling the mold cavities with solder, the molds are inspected at the MIT 200 and then transferred to a ready mold stocker 550. Molds that do not pass inspection are either recycled at the mold clean station 60 or are repaired at the repair tool 88. Molds that are repaired pass through the MIT 200 again and upon passing the inspection are transferred to ready mold stocker 550. In some embodiments the mold repair tool 88 is integrated with the MIT 200. From the ready mold stocker 550 the molds are introduced into the STT 300. Patterned wafers 74 are introduced into the wafer loader 400 and from there into the STT 300. After the solder transfer process the bumped wafers 76 exit the wafer bump station 90 and the dirty molds 62 are introduced into the mold clean station 60 again. The process repeats until all wafers 74 are bumped. A schematic diagram of the HVM IMS equipment system 52 is shown in FIG. 4. It includes the mold clean station 60, the mold stocker 500, the MFT 100, the MIT 200, the STT 300, the wafer loader, i.e., front open unified pod (FOUP) 400 and a mold cart 600. In one example, the HVM system 52 has a capacity of 300 wafer per day (1 wafer every 4 minutes) and 350 molds per day (1 mold every 3.5 minutes). It provides automation of the wafer and mold transfer. The STT can process 200 mm and 300 mm wafers without any hardware changes and each mold carrier can carry up to 25 molds. The molds are identified with a bar code mechanism and the mold stocker/sorter is integrated in the process line. There is also an integrated mold and wafer tracking and management system. The system can accommodate any solder type including no lead/eutectic PbSn (low temperature) at start up and high lead later.

Figure 5:
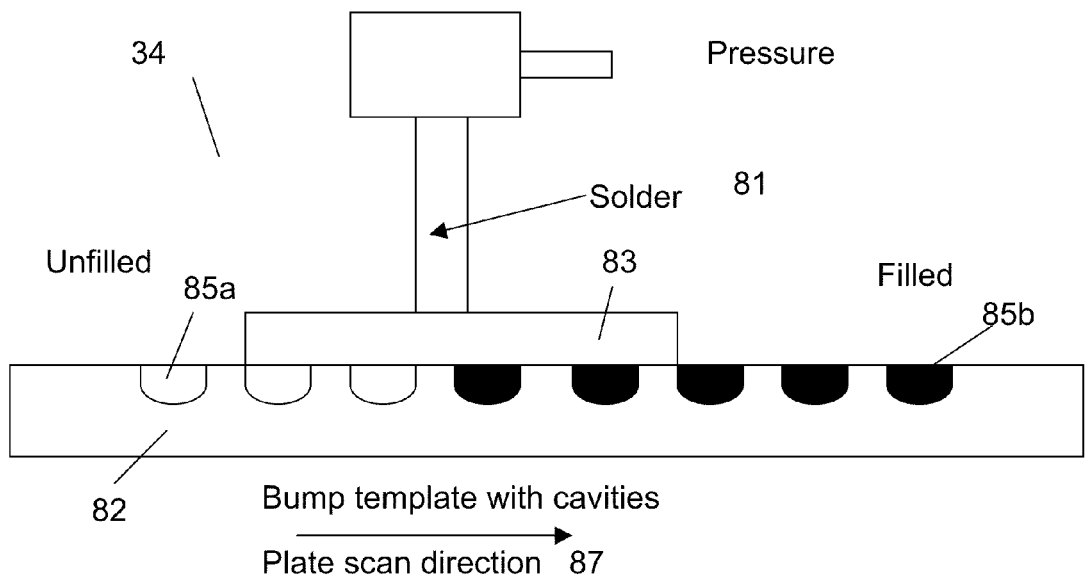
FIG. 5 is a schematic diagram of the mold fill process.
Figure 6:
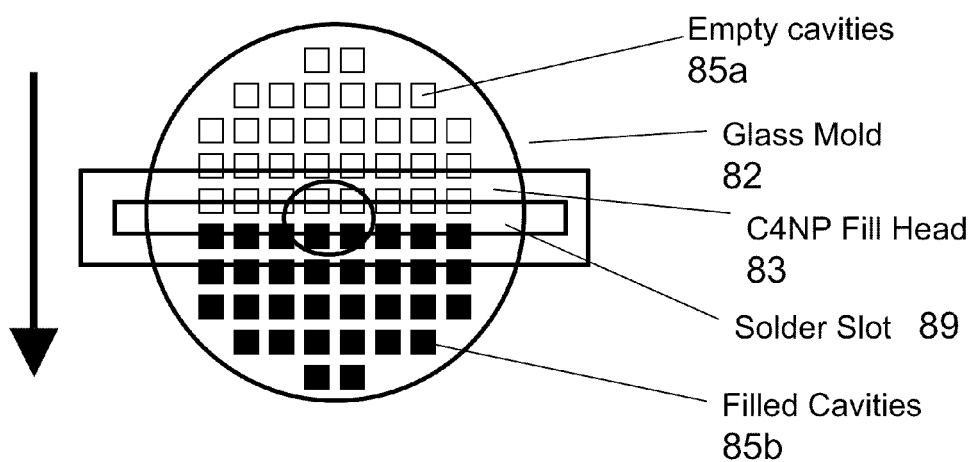
FIG. 6 is a diagram of a partially filled mold plate.
Figure 7A:
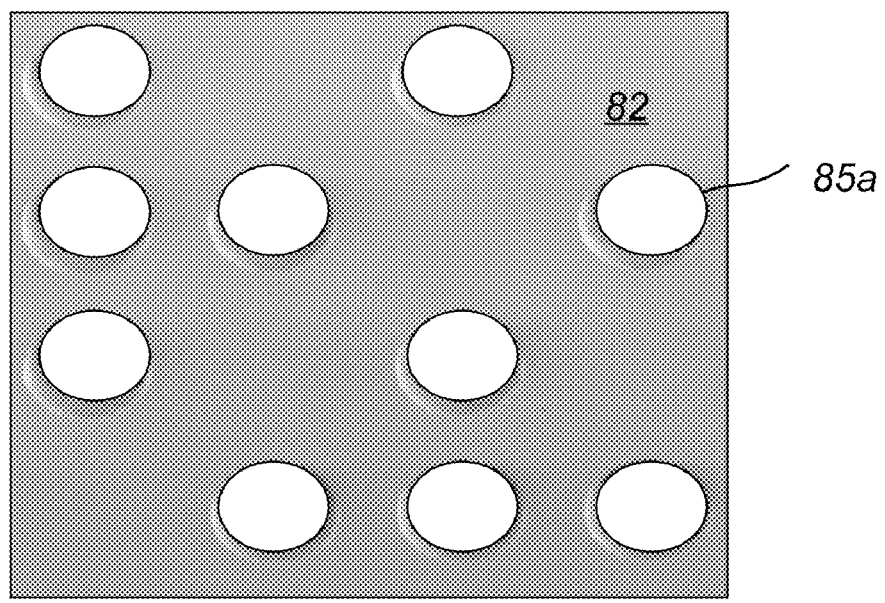
FIG. 7A depicts a mold with unfilled cavities.
Figure 7B:
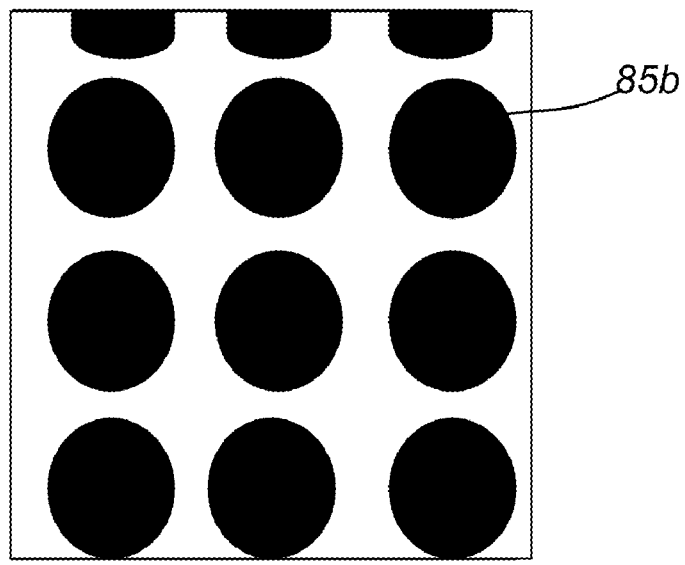
FIG. 7B depicts a mold with filled cavities.

Referring to FIG. 5 and FIG. 6, the mold fill process 34 includes melting bulk solder (wire, shots, slugs) in a reservoir 81. Reservoir 81 is heated above the melting point of the solder and is slightly pressurized. An injector head 83 communicates with the reservoir 81 and is in contact with the mold plate 82. Mold plate 82 is scanned under the injector head 83 in the scan direction 87 and molten solder is injected through a solder slot 89 formed at the bottom of the injector head 83 and fills the empty cavities 85a in the mold 82. The filled mold plate is then cooled and inspected at the MIT 200. FIG. 7A depicts a glass mold plate 82 with unfilled cavities 85a and FIG. 7B depicts a glass mold with filled cavities 85b. Cavities 85 are etched on the glass mold 82 according to the required bump pattern. The glass mold 82 has a thermal expansion coefficient (CTE) similar to the CTE of the semiconductor wafer 72.

Figure 8:
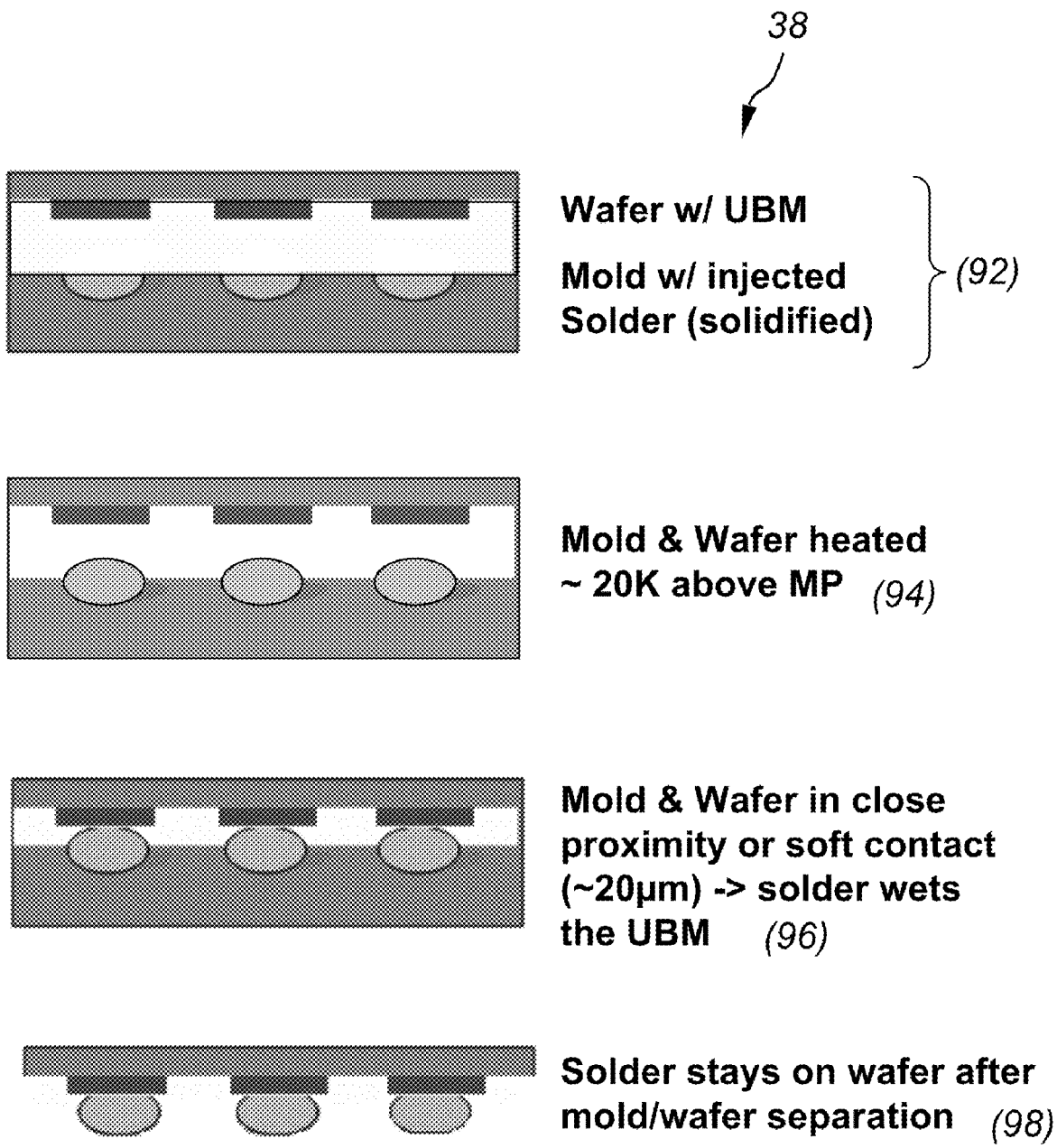
FIG. 8 is a schematic diagram of the solder transfer process.

Referring to FIG. 8, the solder transfer process 38 includes bringing together a wafer 74 patterned with under bump metallurgy (UBM) structures 73 with a mold plate 82 having solder filled cavities 85b (92). Next, heating the mold 82 and the wafer 74 to a temperature of 20 degrees higher than the solder melting point (94) and then bringing the mold 82 and wafer 74 in close proximity ( about 20 micrometers) or soft contact so that the solder wets the UBM structures 73 (96). The solder bumps from the cavities 85b are transferred to the UBM structures 73 and stay on the wafer 74 after the mold 82 separates from the wafer 74 (98). A critical aspect of this process is the alignment of the mold plate 82 relative to the semiconductor wafer 74 so that the solder bumps 85b are transferred to precise UBM structures 73. The alignment needs to be maintained during the transport of the aligned mold-wafer system from station to station and during the actual solder transfer process at the required temperature, atmosphere and pressure. A fixture tool for holding and transferring the aligned mold and semiconductor structures together is described in a related co-pending application Ser. No. 12/025,644, entitled "Apparatus and Method for Semiconductor Bumping via Injection Molded Solder", the contents of which are incorporated herein by reference.

Figure 9:
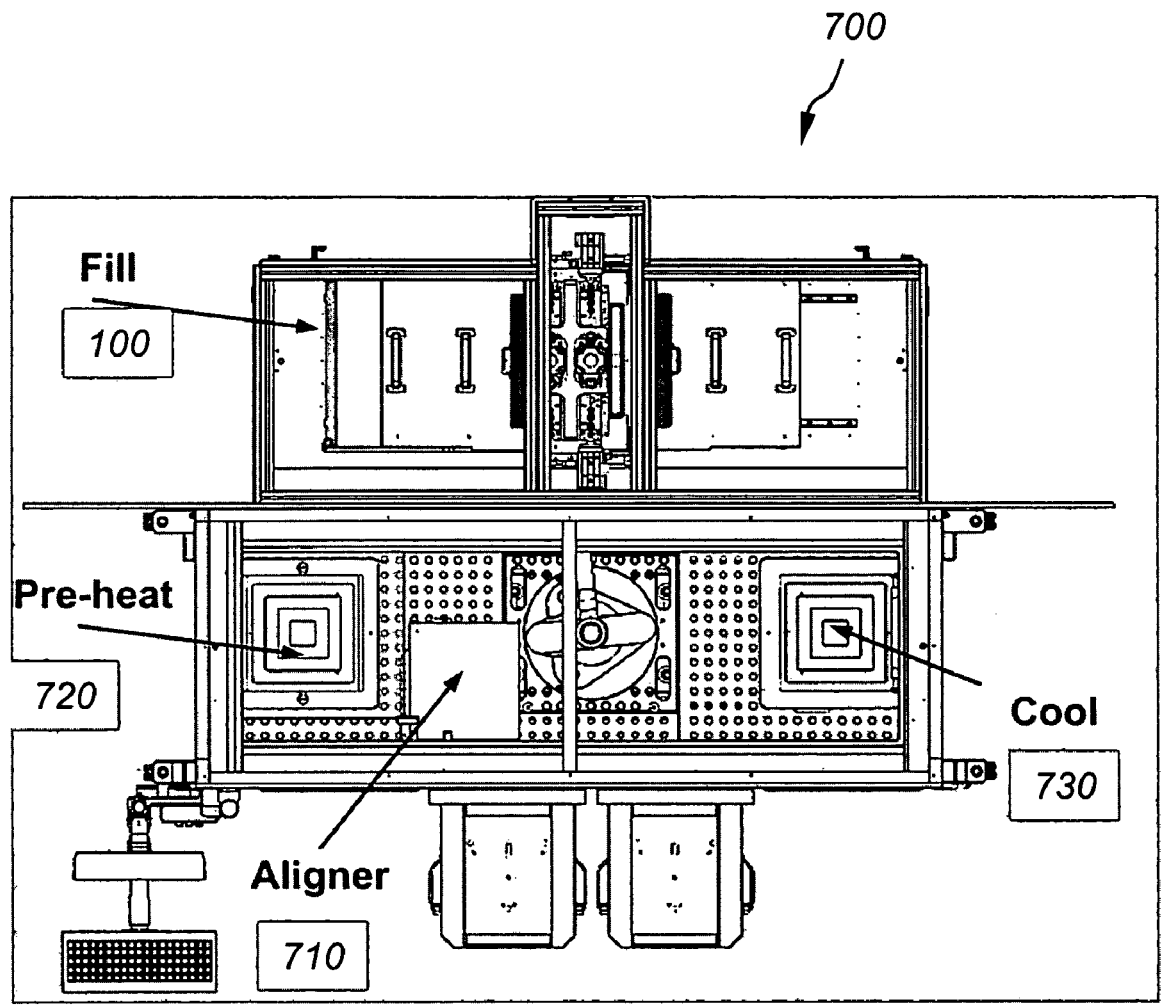
FIG. 9 depicts the HVM MFT equipment system of this invention.
Figure 10:
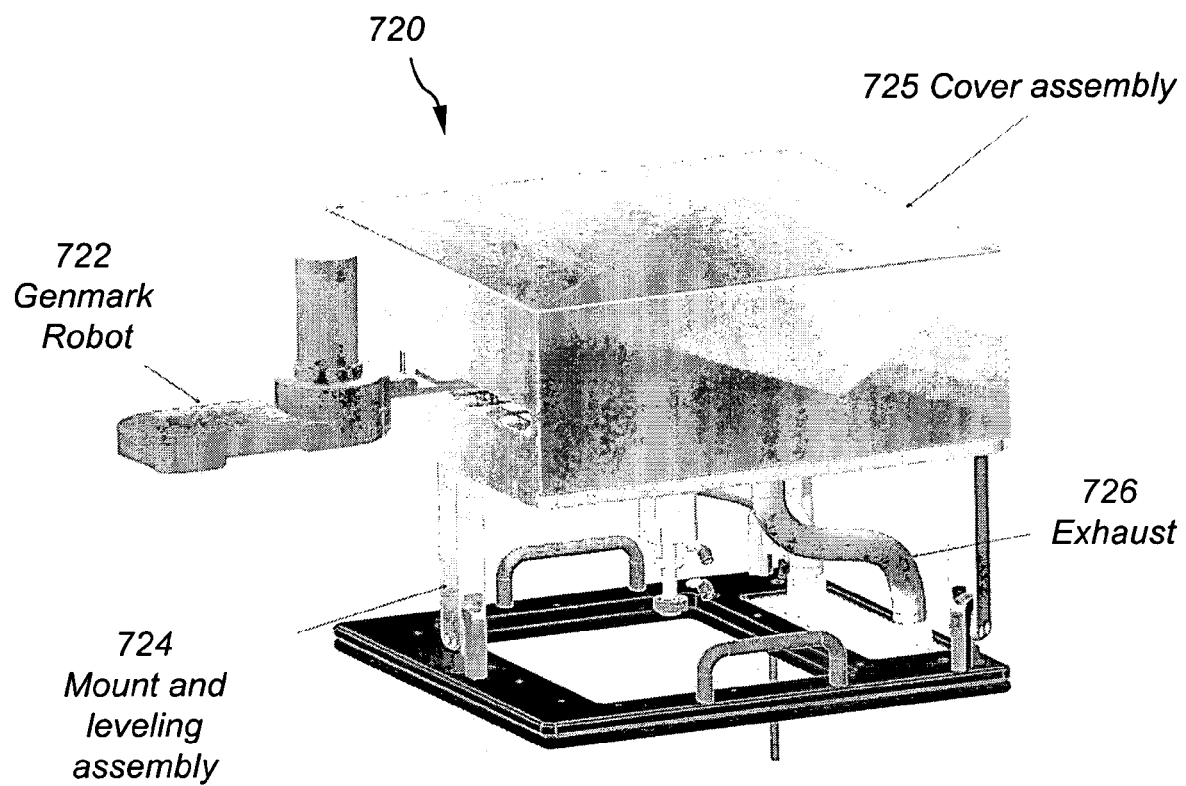
FIG. 10 depicts the mold preheat station.
Figure 11:
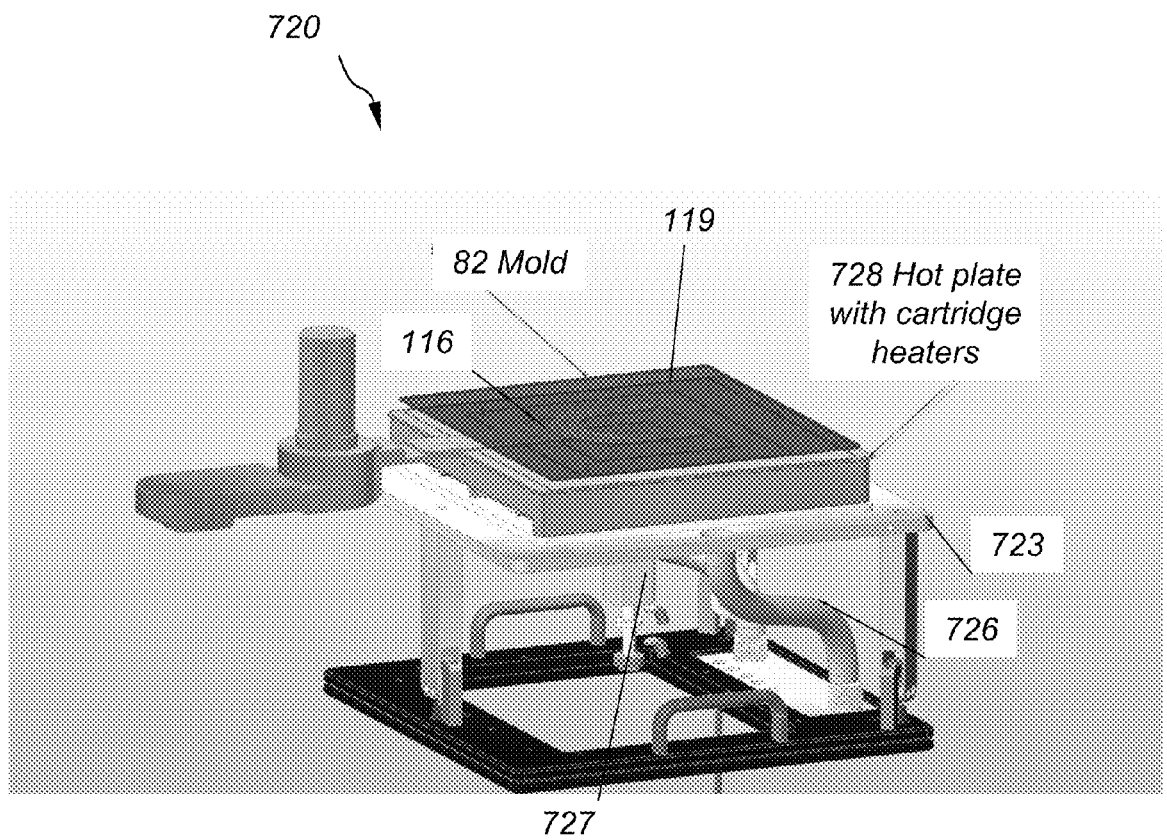
FIG. 11 depicts the mold preheat station of FIG. 10 without a cover.
Figure 12:
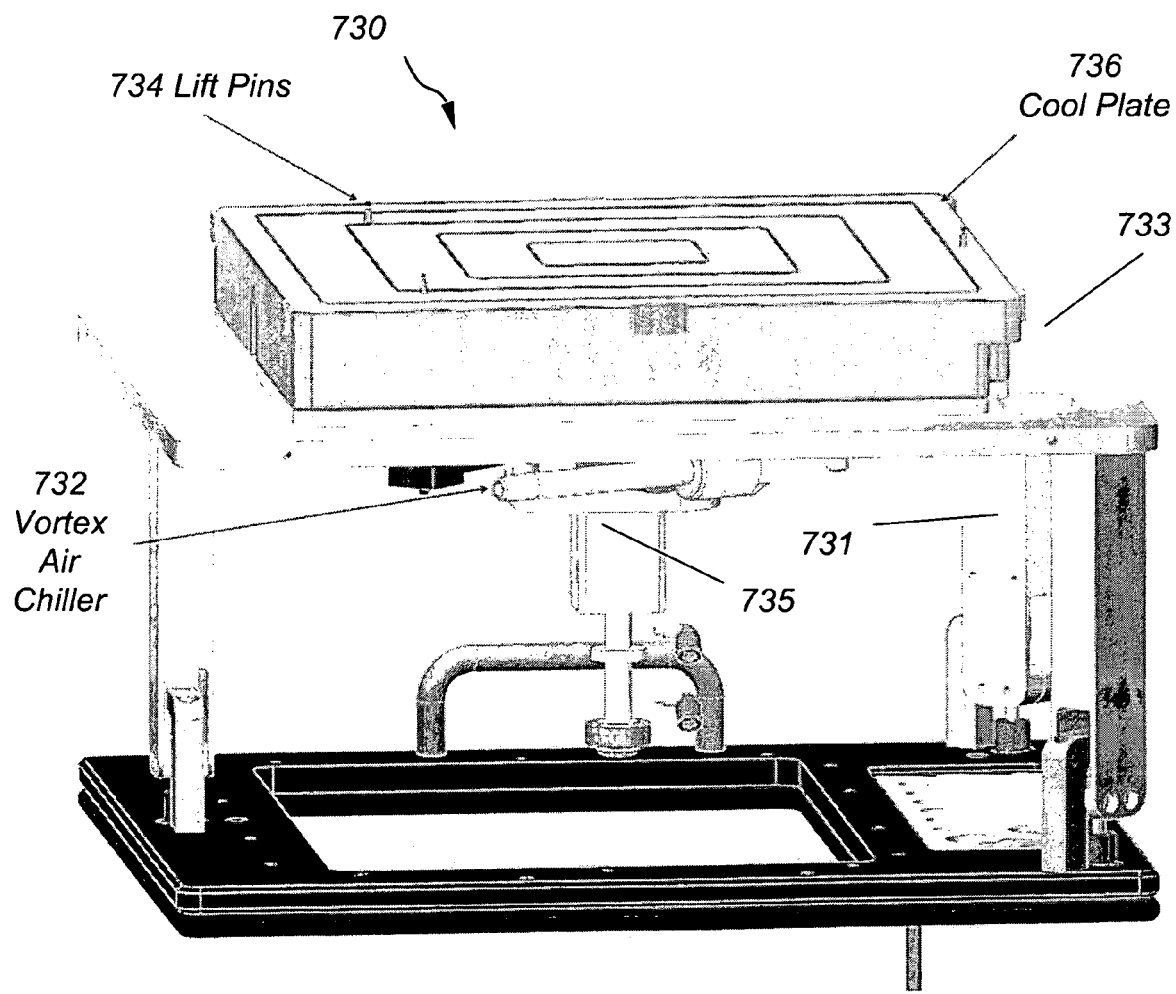
FIG. 12 depicts the mold cooling station.

Referring to FIG. 9, the mold fill apparatus 700 includes a mold aligner 710, a mold pre-heat unit 720, a mold cool unit 730, and the mold fill tool(MFT) 100. Inserting a room temperature glass mold plate 82 in the high temperature MFT tool 100 causes the mold sides to bend upward (warping). Placing the room temperature mold 82 in the mold pre-heat unit 720 and preheating it to a temperature just below the solder melting point before inserting it in the MFT reduces the warping problem. Referring to FIG. 10, and FIG. 11 the mold pre-heat unit 720 includes a hot plate 728 heated with cartridge heaters, a robot end effector 116, a hot plate support plate 723, a mount and leveling assembly for the support plate 724, a gas supply line 727 and an exhaust 726. In one example, the mold is preheated to 200 C and the solder melting point is 217 C. Bringing the hot mold plate from the high temperature MFT tool 100 directly to room temperature also causes warping of the glass mold plate due to the uncontrolled and quick cool down process. To prevent warping during cool down, at the end of the mold filling process, the mold is placed onto the mold cool unit 730 where it is cooled down in a controlled way. Referring to FIG. 12 the mold cool unit 730 includes a cool plate 736 which is cooled with an air chiller 732. The mold is supported on top of the plate 736 with three lift pins 734a-734c. Gas line 735 supplies the gas for the air chiller 732. Cool plate is mounted on top of a support plate 733 which is mounted on top of the leveling assembly 731. Cool plate 736 is made of a good thermal conductor material. In one example, it is made of aluminum.

Figure 13:
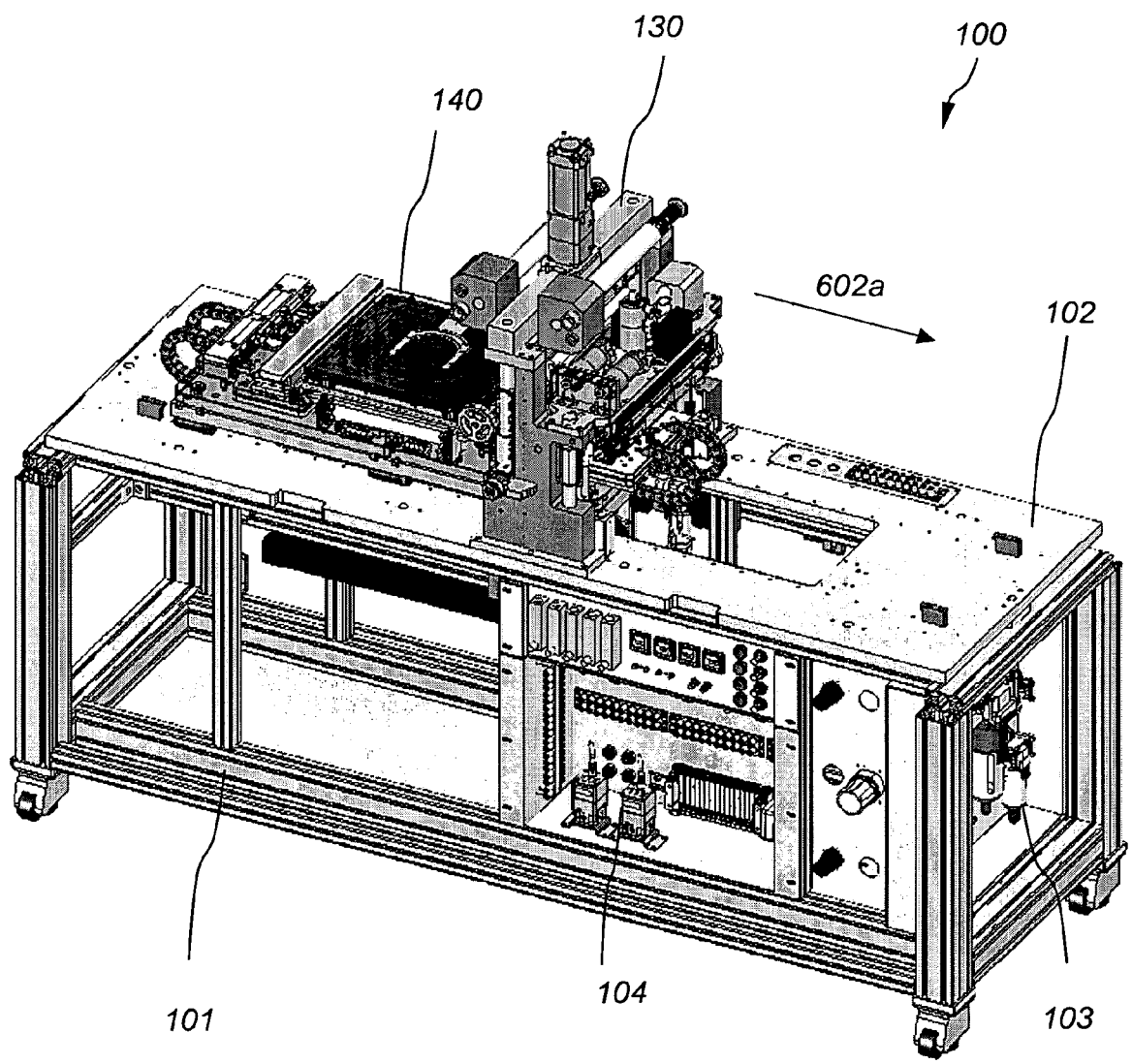
FIG. 13 depicts the HVM MFT station.
Figure 14:
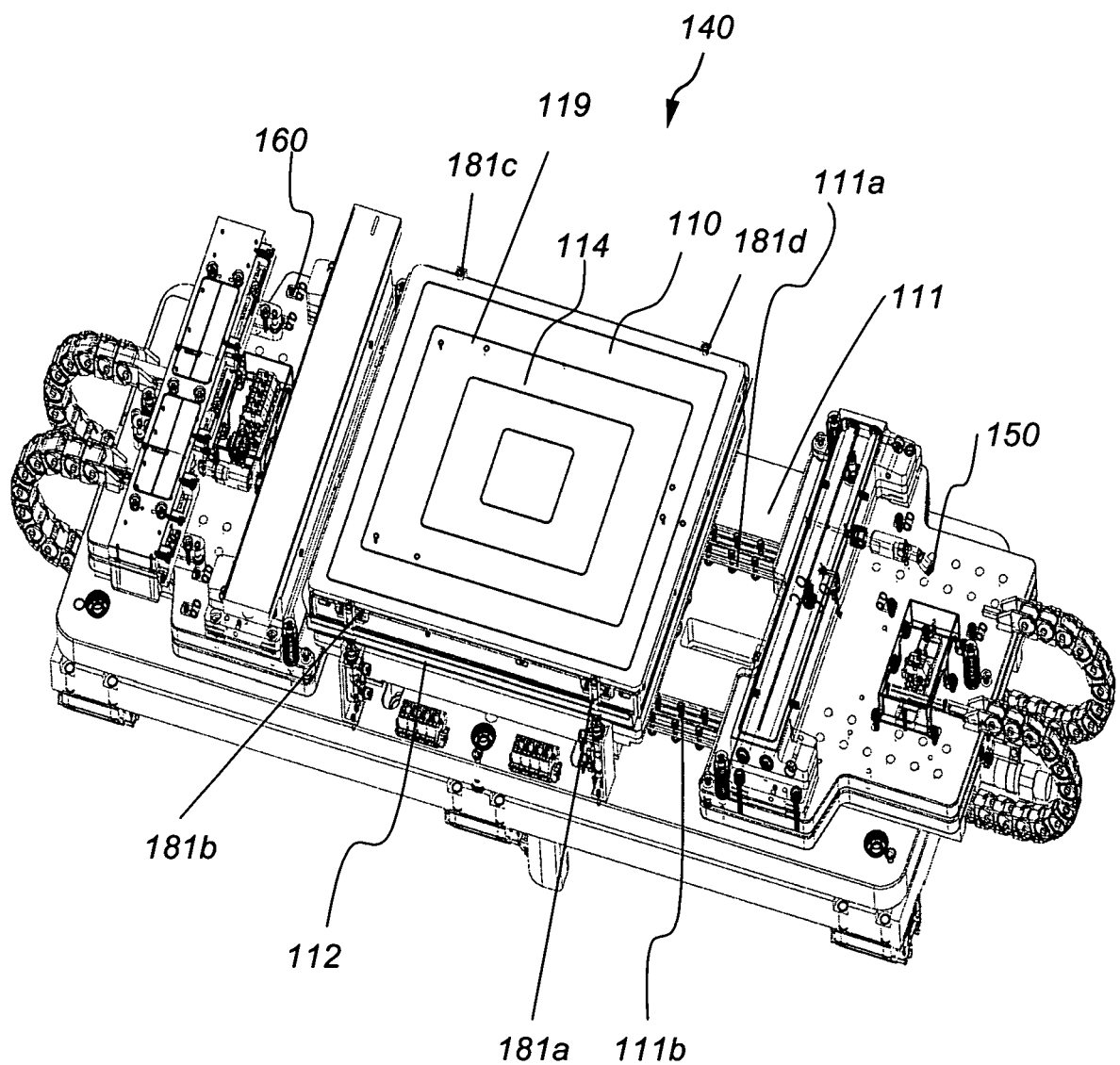
FIG. 14 depicts the hot plate assembly components of the HVM MFT station of FIG. 13.
Figure 15:
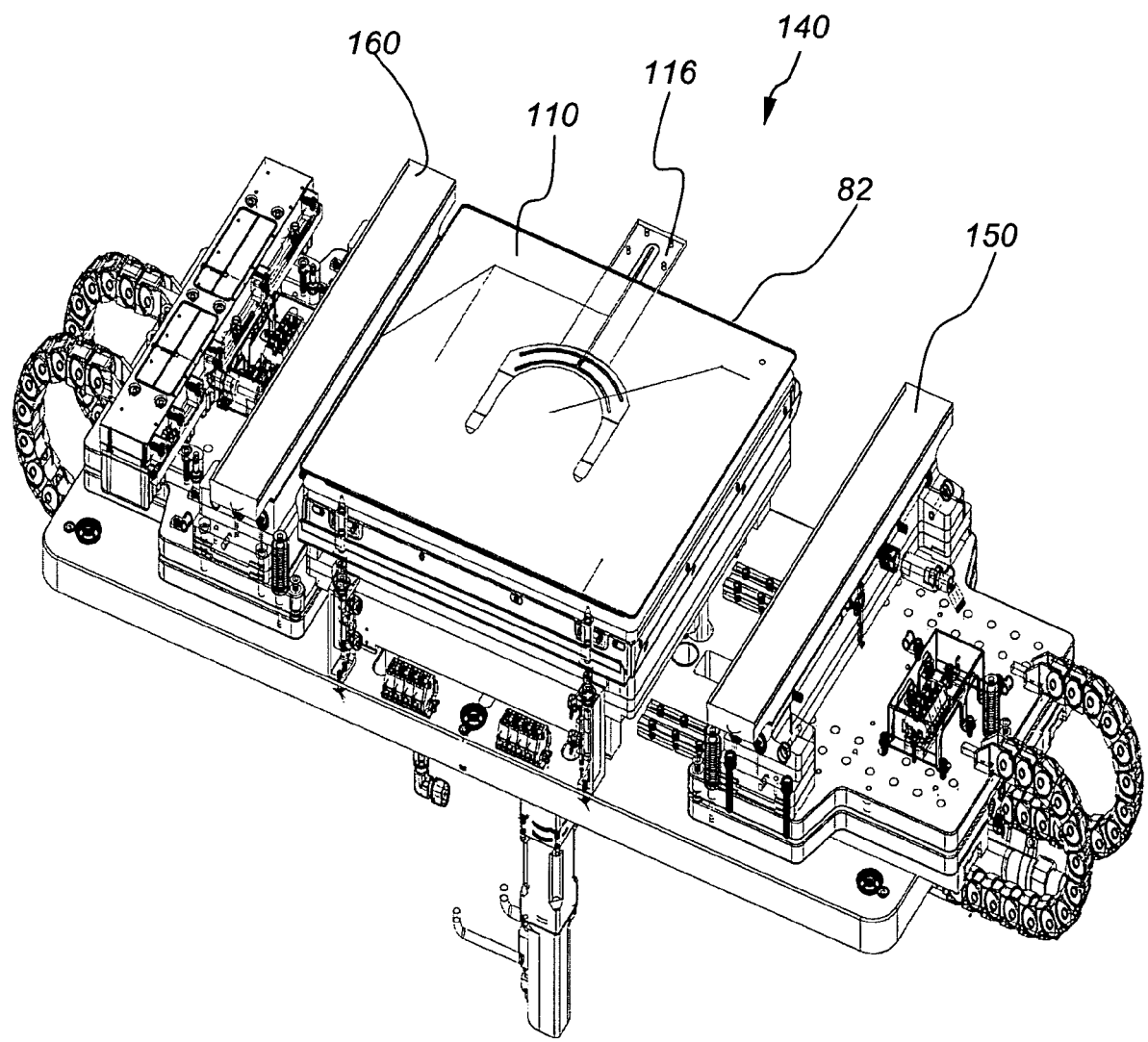
FIG. 15 depicts the hot plate assembly with a mold.
Figure 17:
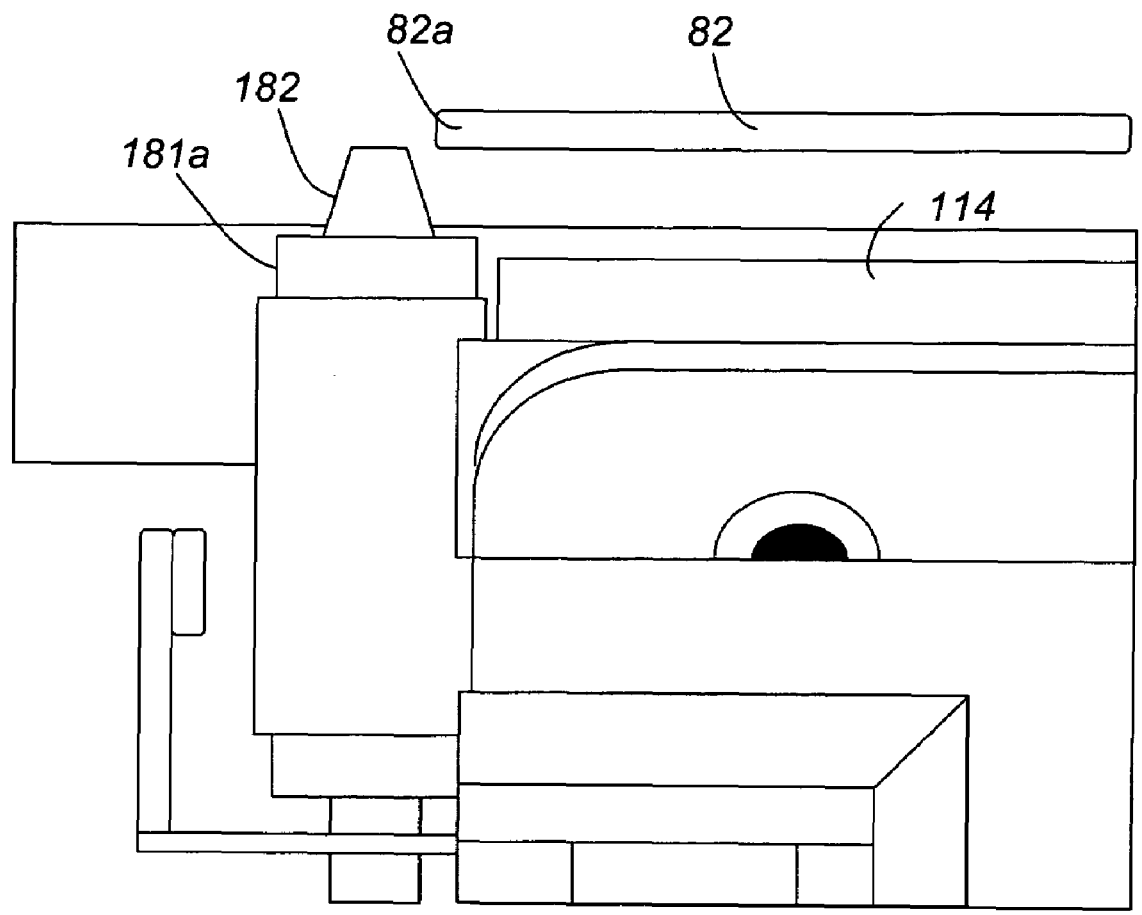
FIG. 17 is a detailed side view of the mold pin alignment mechanism with the pin up.
Figure 18:
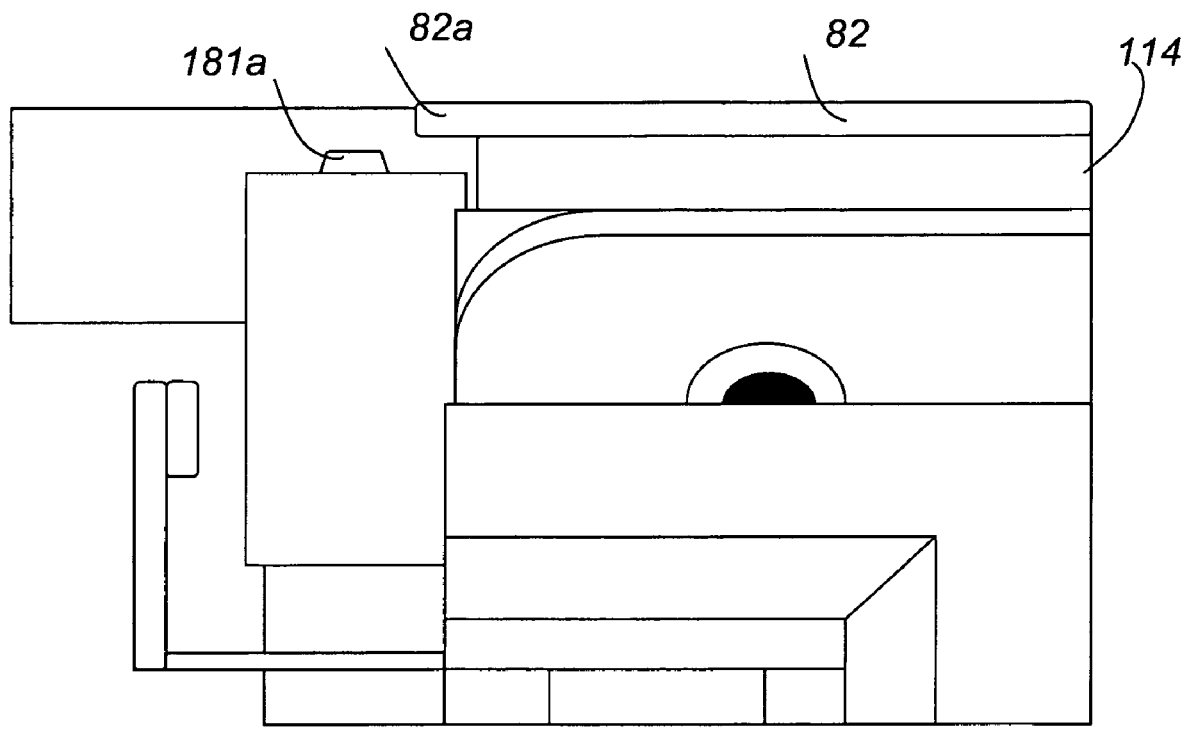
FIG. 18 is a detailed side view of the mold pin alignment mechanism with the pin down.

Referring to FIG. 13 the MFT tool 100 includes a table 101 having a top 102 upon which a carriage assembly 140 and a solder head assembly 130 are mounted. A mold plate 82 with unfilled cavities is placed in the carriage assembly 140 and is scanned (i.e., moved) under the solder head assembly 130 along direction 602a, shown in FIG. 13. During this scanning molten solder is injected from the stationary solder head assembly into the mold cavities. Carriage assembly 140 includes a hot plate assembly 110, a start space 150 and a finish space 160, as shown in FIG. 14. The hot plate assembly 110 includes a stage 112 that moves on rails 111a, 111b. Stage 112 supports the hot plate 114 upon which the mold 82 plate is mounted. A robot end effector (REF) 116 moves the mold plate 82 on and off the hot plate 114, shown in FIG. 15. The positioning of the mold on and off the plate is guided with four mold guide pins 181a, 181b, 181c, 181d. The ends of each pin 181a-181d are frusto-conically shaped and are positioned and dimensioned so that their conical sides 182 guide the rounded edges 82a of the mold plate 82 and move the plate 82 sidewise, up or down as the pins move up or down, as shown in FIG. 17 and FIG. 18, respectively. Table 101 also includes gas supply lines 103 and pressure control valves 104.

Figure 16:
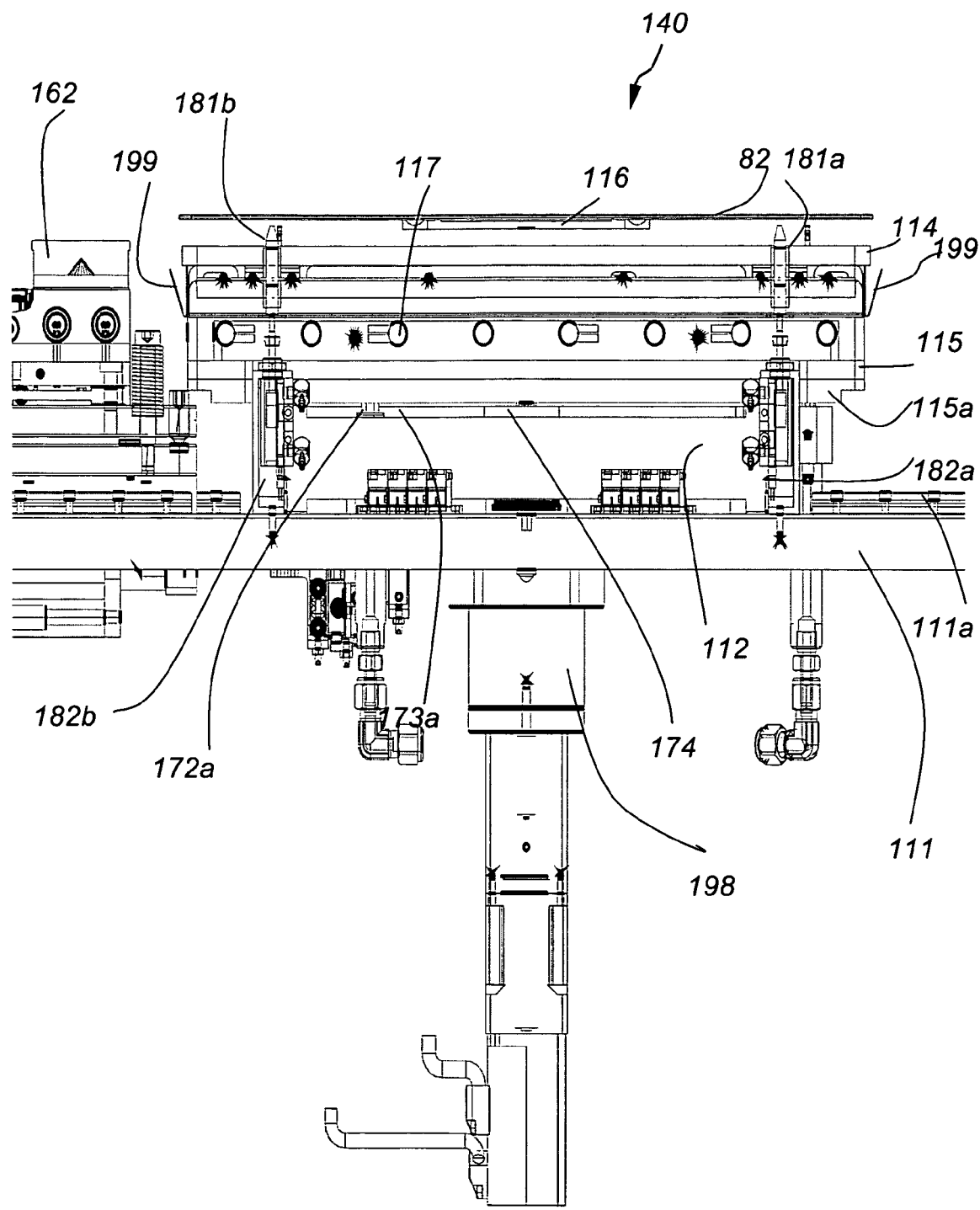
FIG. 16 is a detailed side view of the hot plate assembly of FIG. 15.
Figure 19:
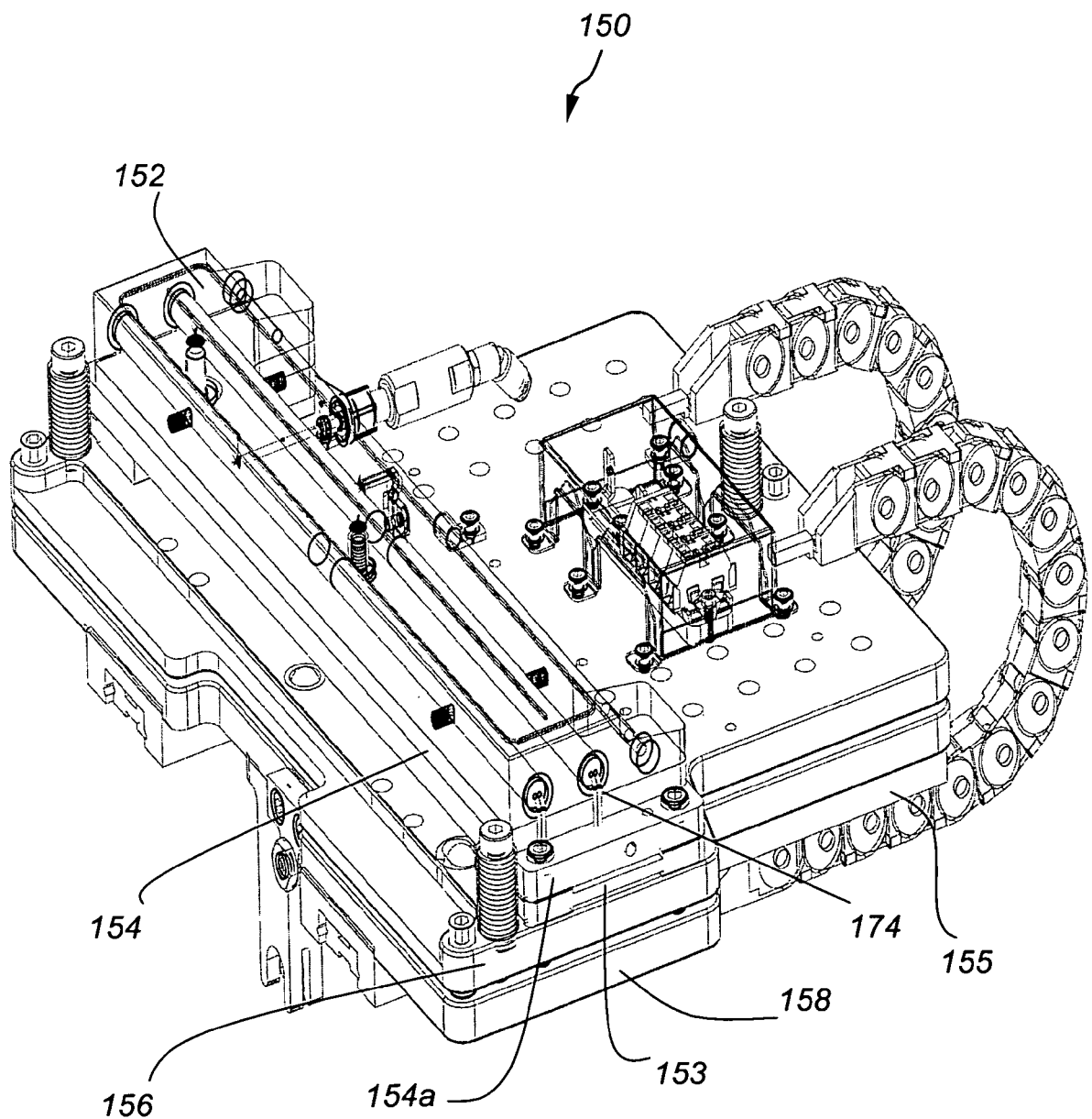
FIG. 19 is a perspective view of the staring parking space.
Figure 20:
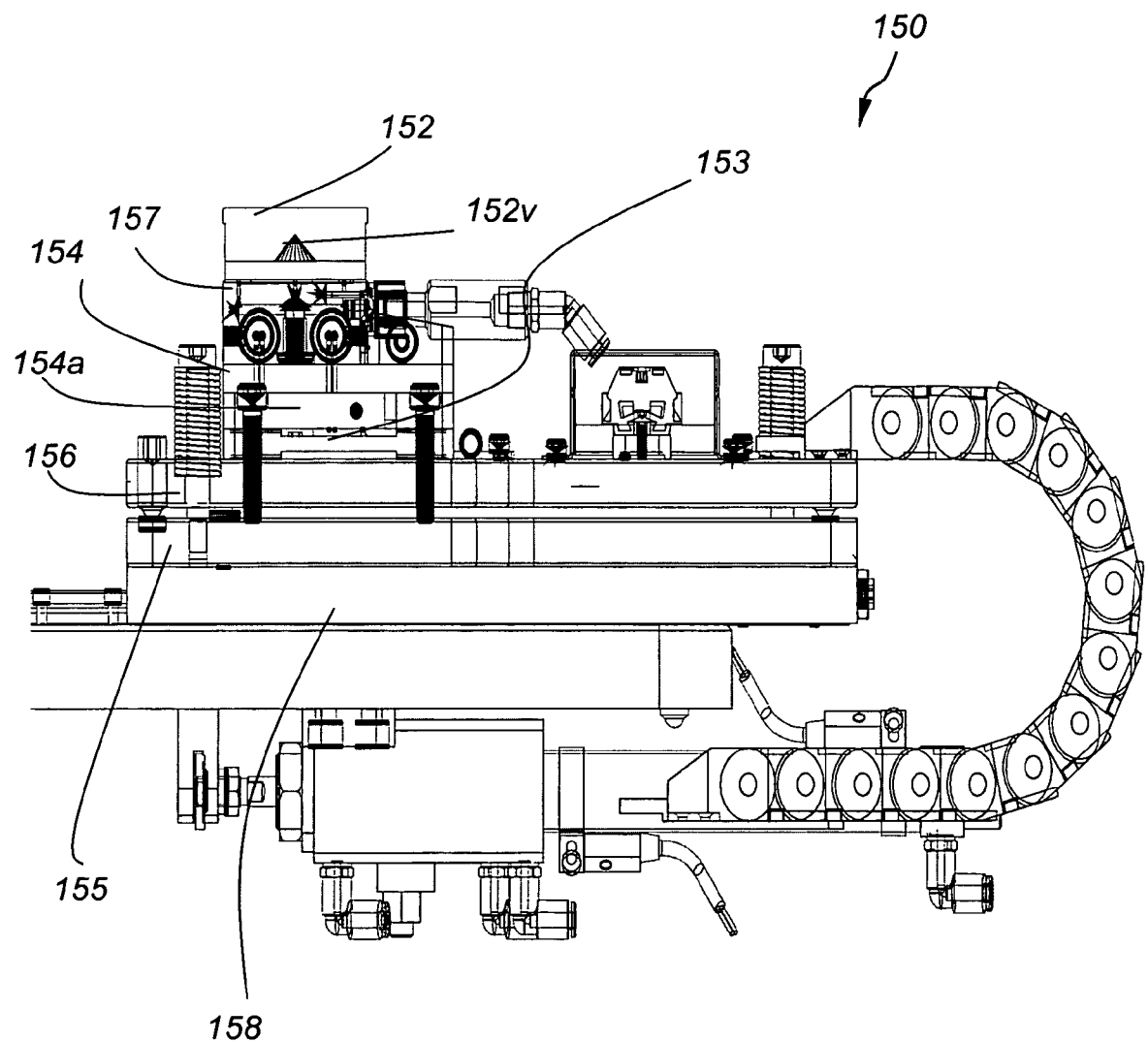
FIG. 20 is a side view of the staring parking space.
Figure 23:
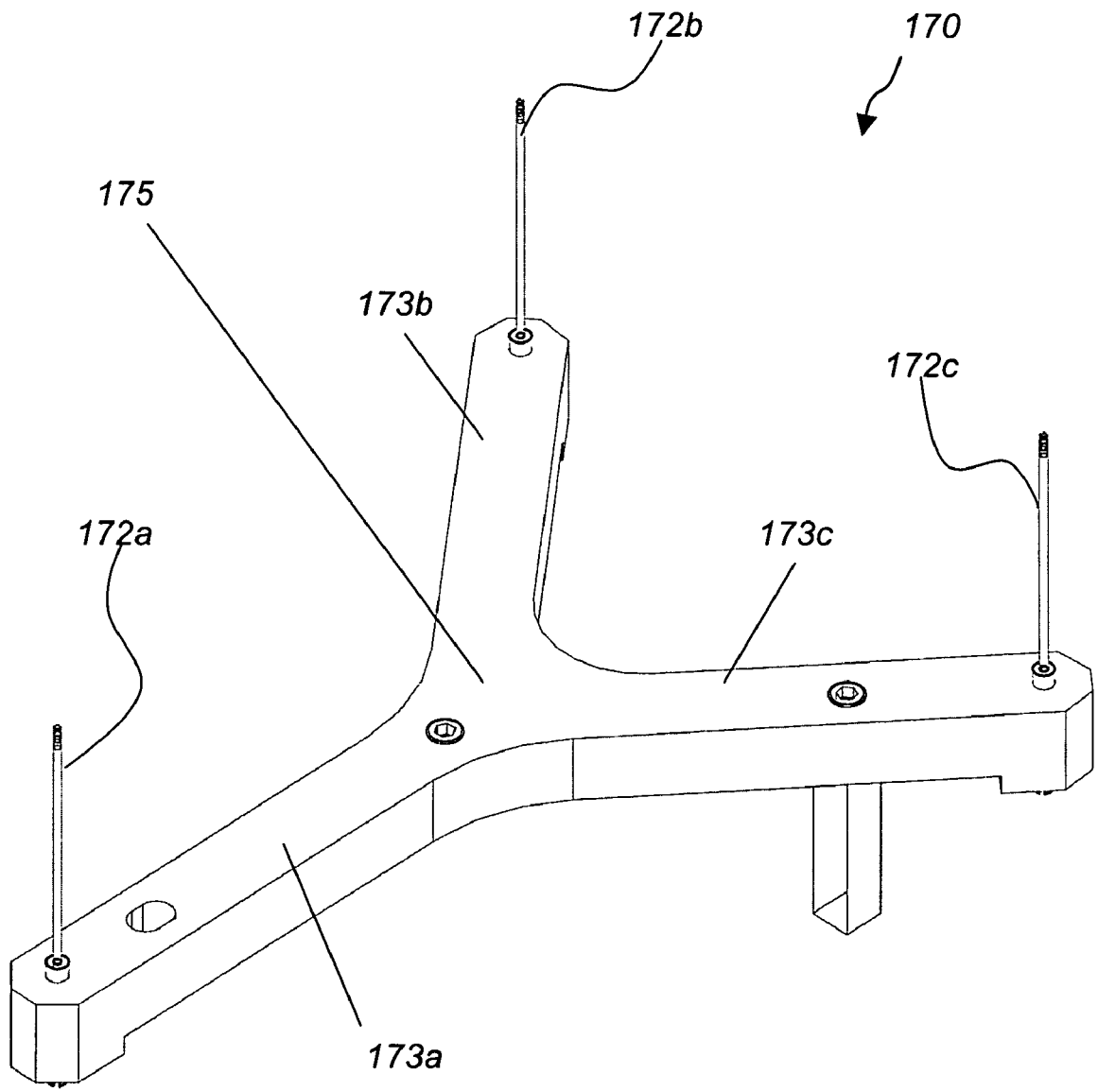
FIG. 23 is a side perspective view of the three pin motorized mount system.

Referring to FIG. 16, hot plate 114 is mounted on top of a hot plate insulator 115 which in turn is mounted on top of a backing plate 115a. In one example insulator plate 115 is made of Calcium Silicate. Cartridge heaters 117 are used for heating the hot plate 114. The top surface 118 of the hot plate 114 includes grooves 119 (shown in FIG. 11) having small holes through which vacuum is drawn. The vacuum is used to hold the mold 82 onto the hot plate 114. Mold 82 is kinematically mounted on top of the hot plate 114 via a three pin motorized mount 170, shown in FIG. 23. Pins 172a, 172b, 172c are arranged at 120 degree angles relative to each other and are used to guide the lifting and lowering of the mold 82 onto the hot plate 114. Mount 170 includes three arms 173a, 173b, 173c extending from the center 175 at 120 degrees angles relative to each other. Pins 172a, 172b, 172c extend upward from the top surfaces of the ends of each arm 173a, 173b, 173c, respectively. In one example pins 172a-172c are made of polyamide. Referring to FIG. 19 and FIG. 20 the start space assembly 150 includes a starting parking space 152 which is mounted on top of the base parking element 157. Starting parking space 152 includes a V-groove 152v on it bottom surface. Base parking element 157 is mounted on top of insulator plate 154 and insulator plate 154 is mounted on top of backing plate 154a. A ceramic spacer 153 separates the backing plate 154a from the first leveling plate 156 which is mounted on top of a second leveling plate 155. Leveling plate 155 is mounted on top of support plate 158, which in turn is set on top of the hot plate sled 111.

Figure 21:
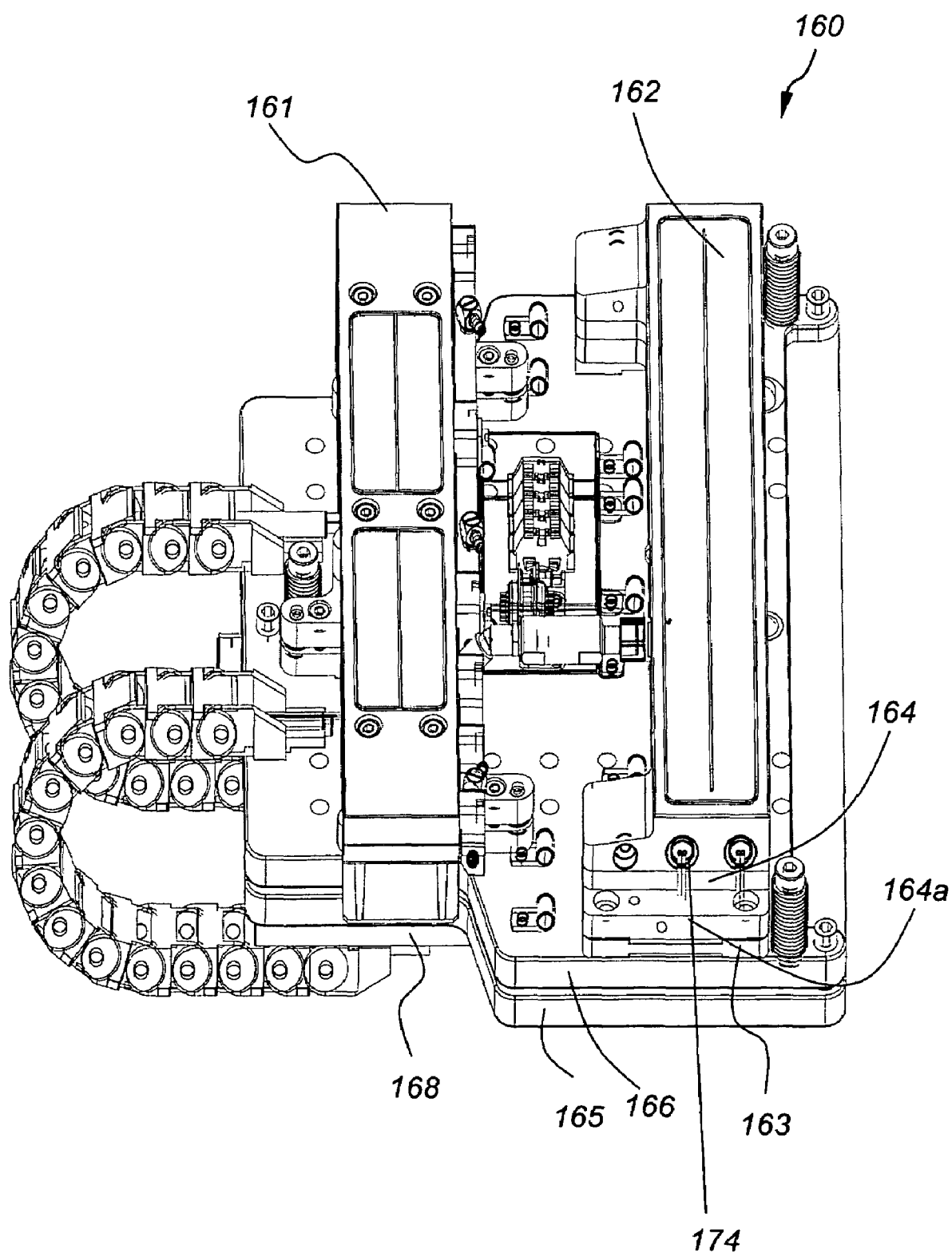
FIG. 21 is a perspective view of the finish parking space.
Figure 22:
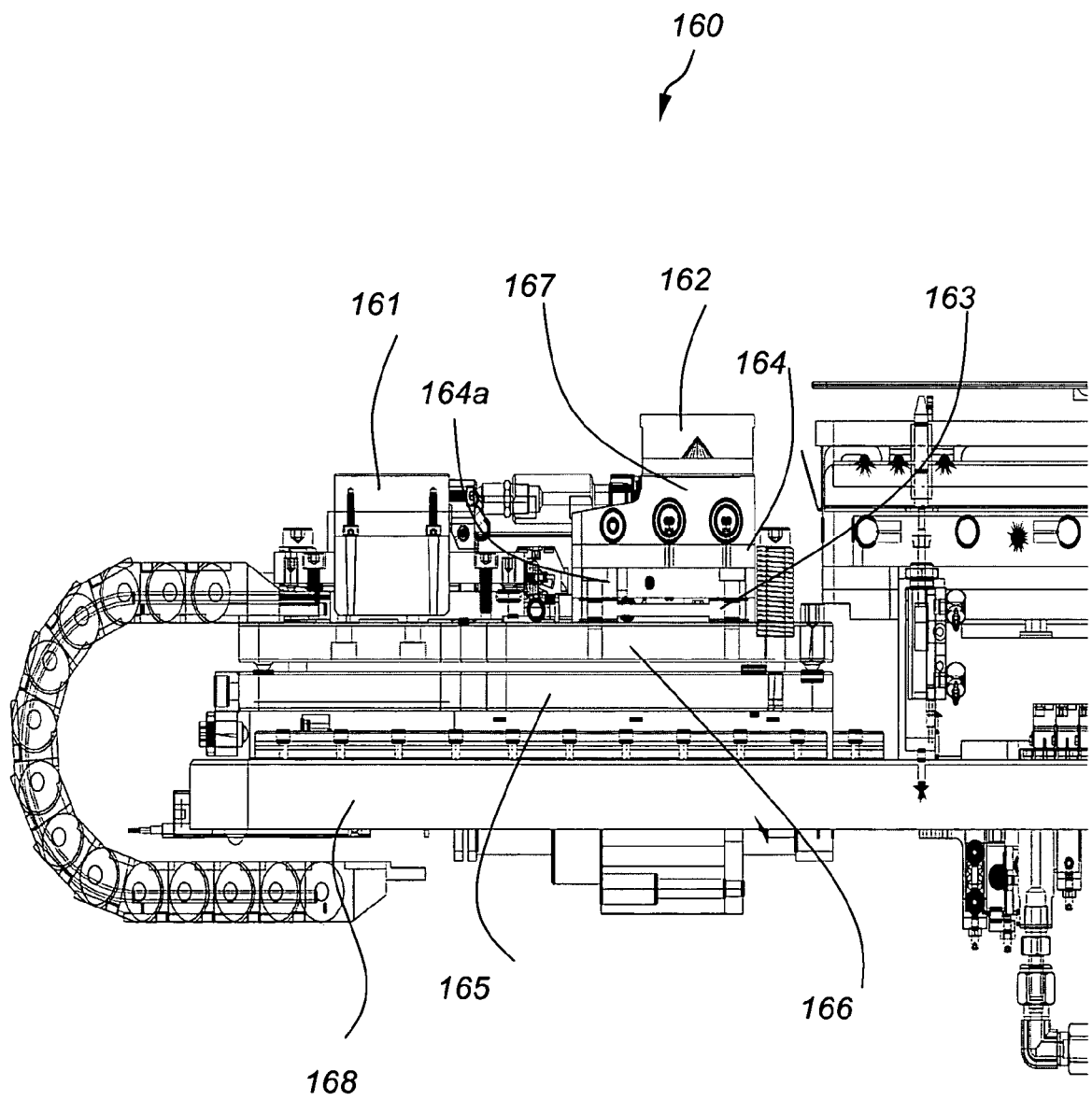
FIG. 22 is a side view of the finish parking space.

A mirror image finish parking space assembly 160 is on the opposite end of the carriage assembly 140. Referring to FIG. 21 and FIG. 22 the finish space assembly 160 includes the finish V-groove parking space 162 which is mounted on top of the base parking element 167. Base parking element 167 is mounted on top of insulator plate 164 and insulator plate 164 is mounted on top of backing plate 164a. A ceramic spacer 163 separates the backing plate 164a from the first leveling plate 166 which is mounted on top of a second leveling plate 165. Leveling plate 165 is mounted on top of support plate 168, which in turn is set on top of the hot plate sled 111. In addition to these elements, finish space assembly 160 includes a fixed stop heat sink 161 adjacent to the finish parking space 162. An air cylinder 251 connects the fixed stop 161 with the base parking element 167. Both parking spaces 152, 162 are heated to a temperature slightly above the melting point of the solder used for filling the mold cavities with cartridge heaters 174.

Figure 24:
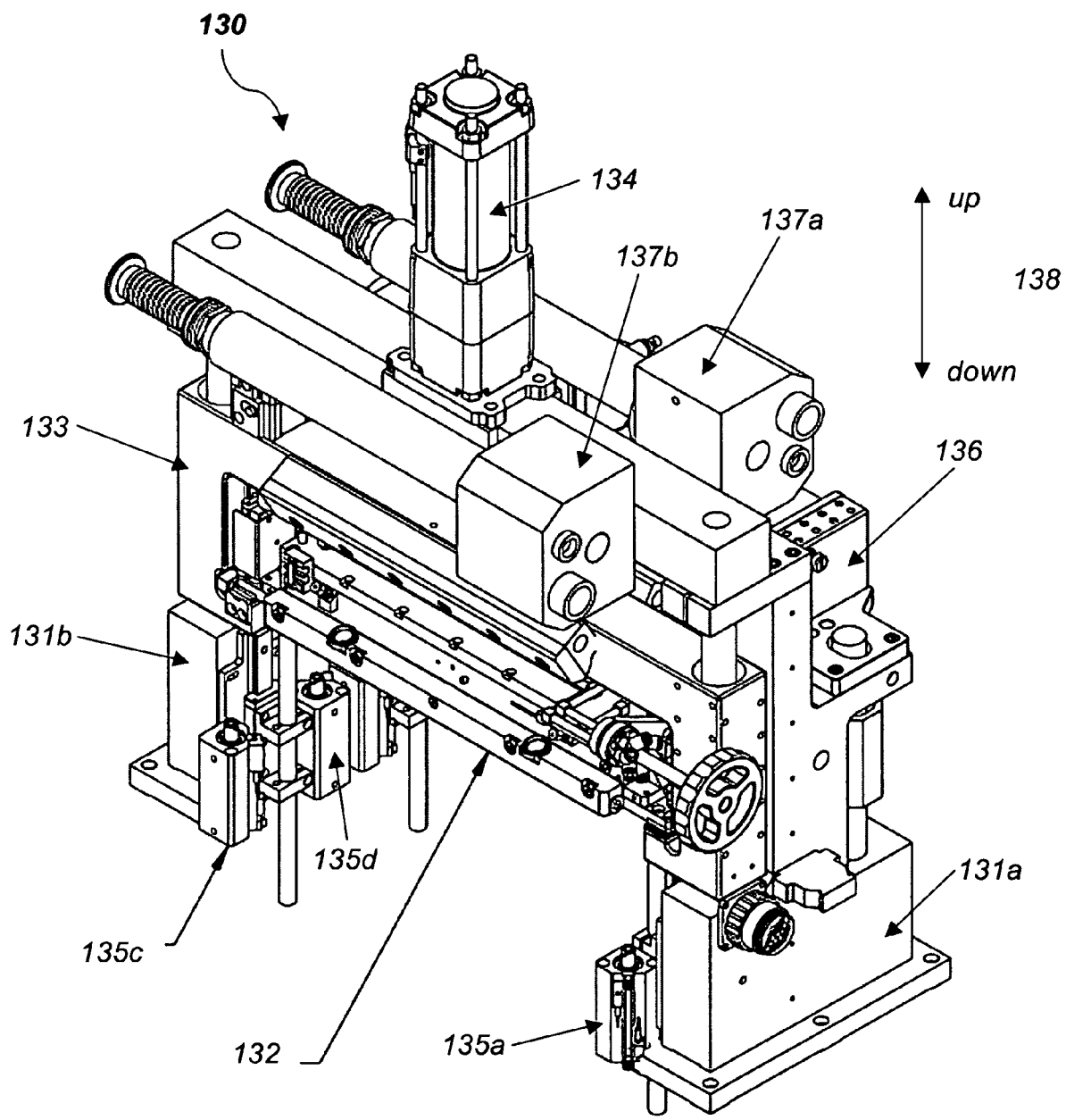
FIG. 24 is a front perspective view of the solder head assembly.

Referring to FIG. 24, the solder head (or gantry) assembly 130 includes two support elements 131a, 131b, supporting an injector head slide assembly 133 carrying an injector head assembly 132, an injector head lift cylinder 134, two pairs of first and second parking space lifters 135a, 135b (not shown) and 135c, 135d, a parking space cleaner assembly 136 and two process gas heaters 137a, 137b. The parking space lifters 135a-135d are designed to pick up the start or finish parking spaces 152, 162 and lift them up or down in the direction of 138.

Figure 25:
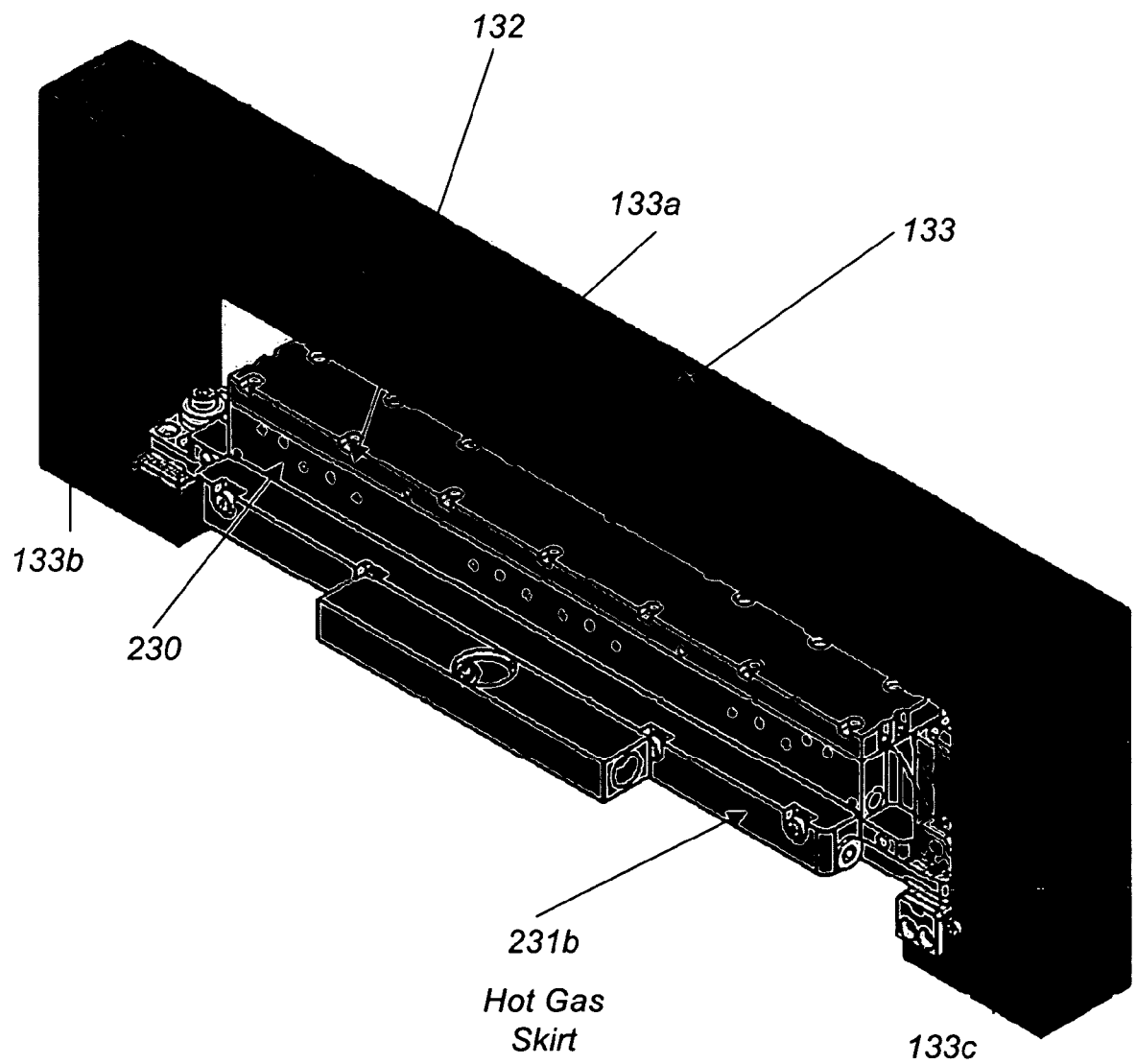
FIG. 25 is a front perspective view of the injector head.
Figure 26:
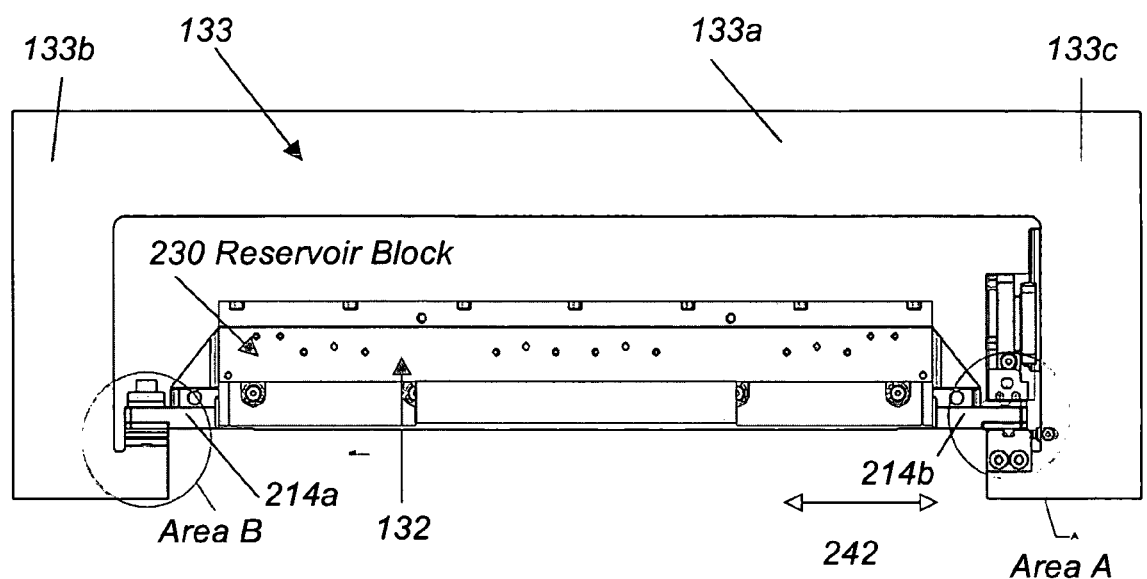
FIG. 26 is a front view of the injector head.
Figure 27:
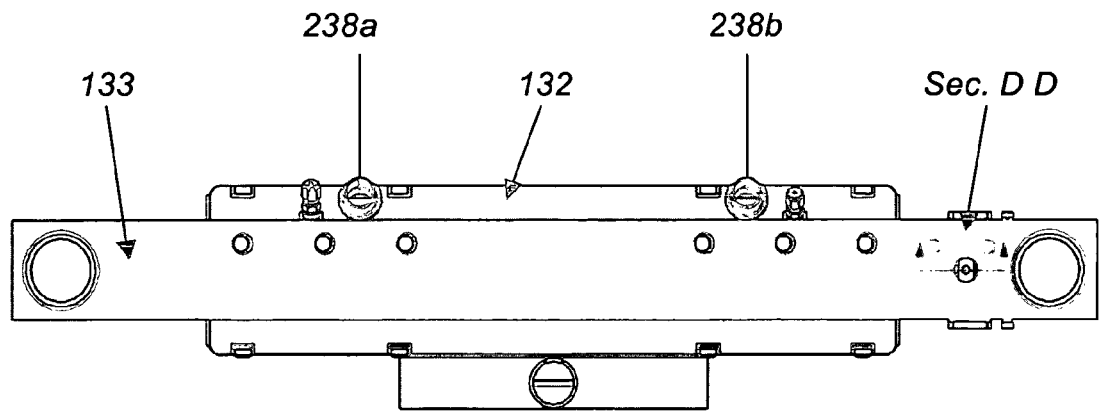
FIG. 27 is a top view of the injector head.
Figure 28:
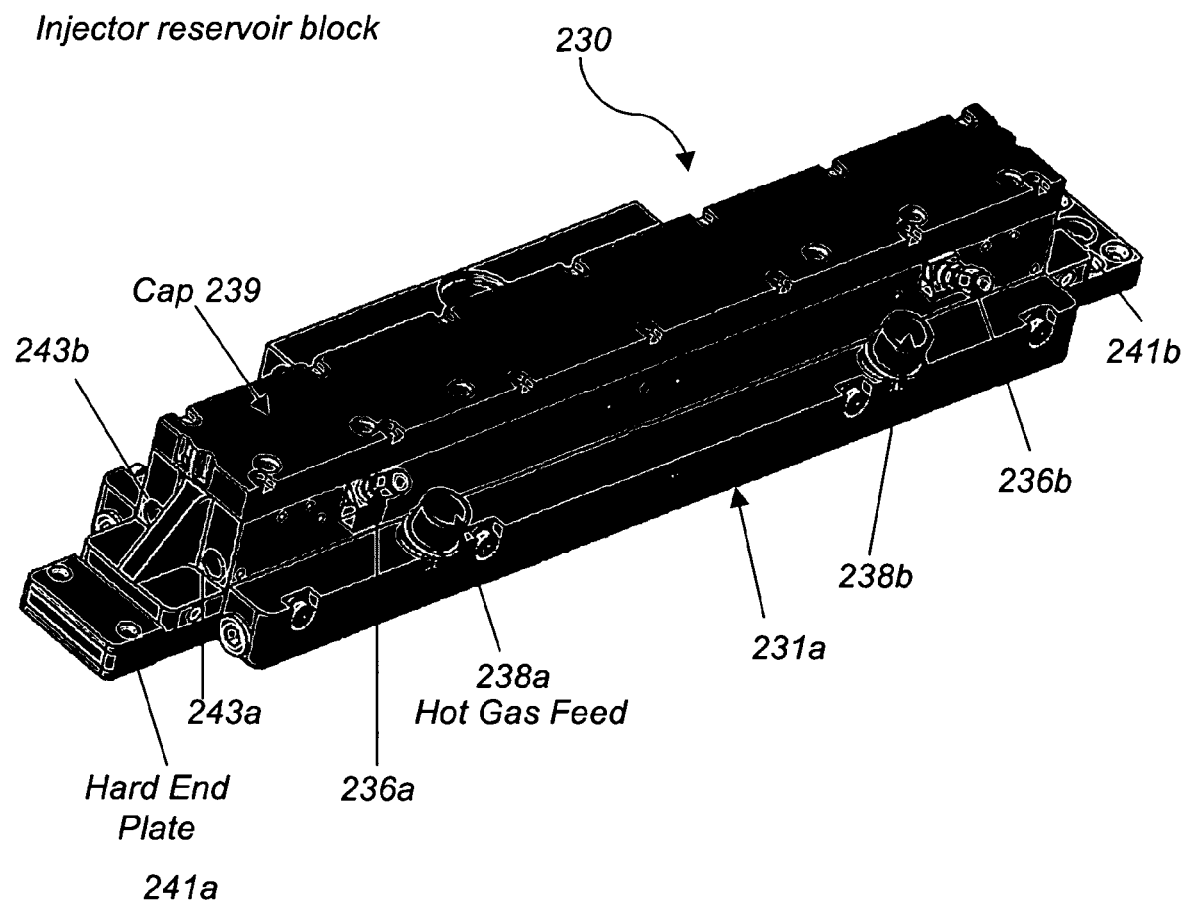
FIG. 28 is a perspective view of the injector reservoir.
Figure 29:
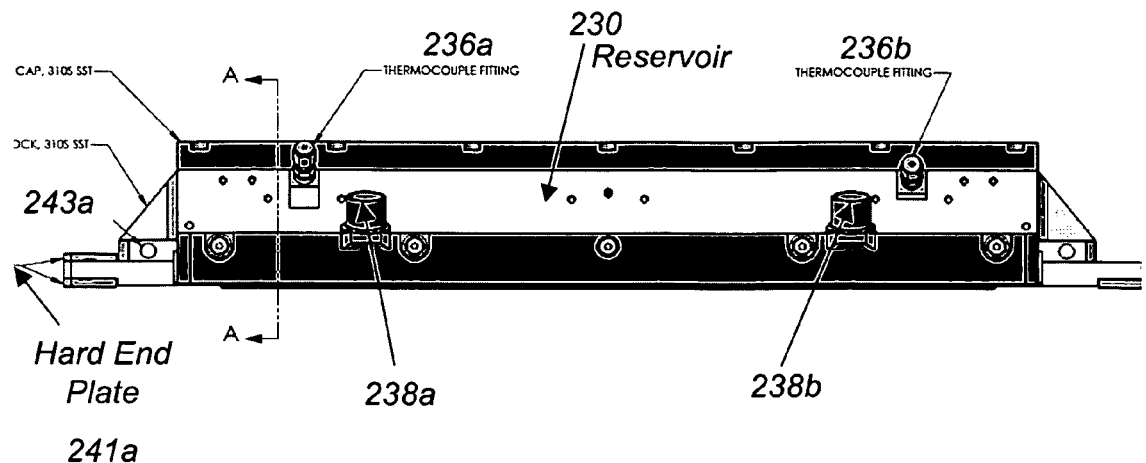
FIG. 29 is a front view of the injector reservoir of FIG. 28.

Referring to FIG. 25- FIG. 26 the injector head slide assembly 133 includes a cross bar 133a having two downward extending legs 133b, 133c. The bottoms of legs 133b, 133c extend sidewise to provide mounting surfaces for the injector head assembly end plates 241a, 241b, shown in FIG. 26. The mounting mechanism in areas A and B stabilizes the position of the reservoir 230 while allowing for small thermal expansions sidewise in the direction of 242. The injector head slide assembly is made of a material that has very low coefficient of thermal expansion (CTE) and remains stable at high temperatures. In one example, head slide assembly 130 is made of Invar alloy.

Referring to FIG. 27-FIG. 30, the injector head assembly 132 includes a solder reservoir block 230 and hot gas skirt elements 231a, 231b having hot gas feeds 238a, 238b. Reservoir block 230 has a cap 239 and thermocouple feeds 236a, 236b leading two separate thermocouples 237a, 237b, to two different prearranged heights of the solder baths. A valid thermocouple reading indicates that the solder bath level is at the prearranged height where the thermocouple is mounted. The two thermocouple readings are used to monitor the fill level of the solder bath. More than two thermocouples may be used and a finer height selection may be arranged. The reservoir block 230 is supported with two hard end plates 241a, 241b at the bottom of the injector head slide assembly 133 in areas A and B, as shown in FIG. 26.

Figure 30:
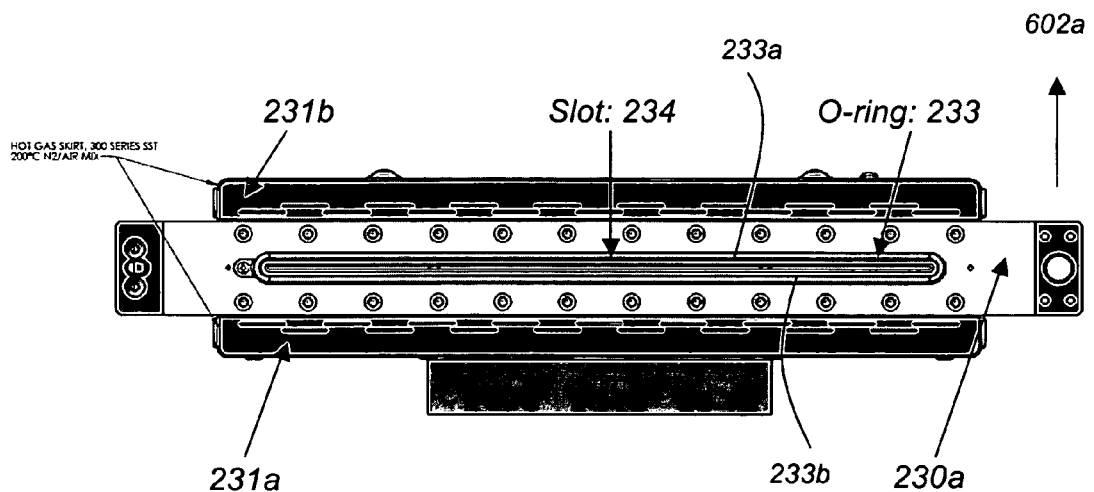
FIG. 30 is a bottom view of the injector reservoir of FIG. 28.
Figure 31:
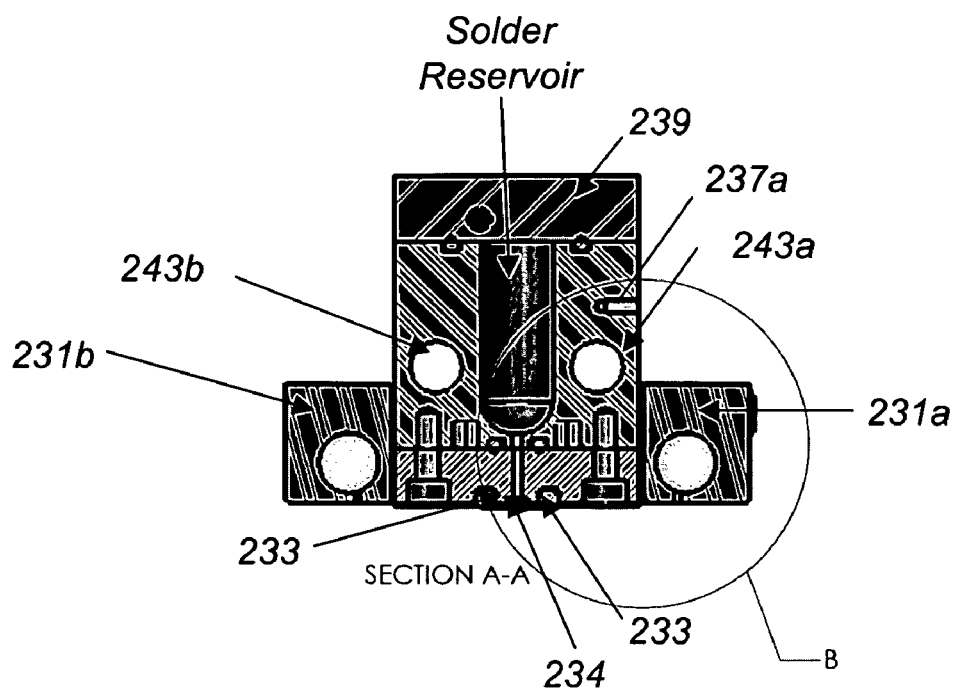
FIG. 31 is a detailed view of section A-A of the injector reservoir of FIG. 29.

Referring to FIG. 30 the bottom surface 230a of reservoir 230 includes a slot 234 surrounded by O-ring 233. For the mold filling process, surface 230a is brought into contact with the mold plate and molten solder is injected through slot 234 into the mold cavities. O-ring 233 is designed to sustain the high melt temperatures of solder. Hot gas is blown onto and around the bottom surface 230a through the hot gas skirt elements 231a, 231b. In one example the hot gas is a mixture of nitrogen with air and the gas temperature is 200 C. The solder reservoir block is heated to a temperature above the solder melting point with cartridge heaters 243a, 243b.

Figure 33:
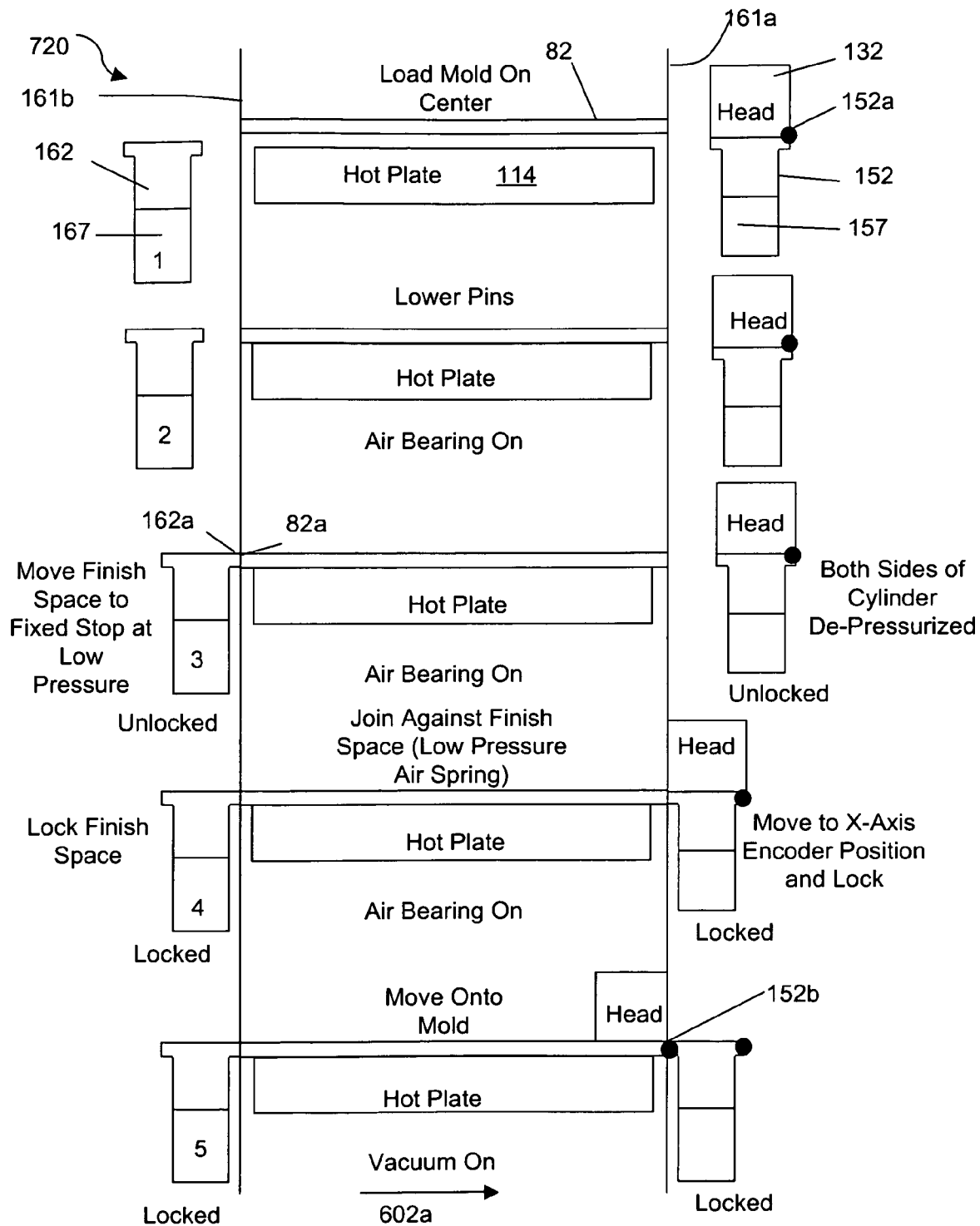
FIG. 33-FIG. 36 are schematic diagrams of the process steps of scanning the hot plate under the injector head.
Figure 34:
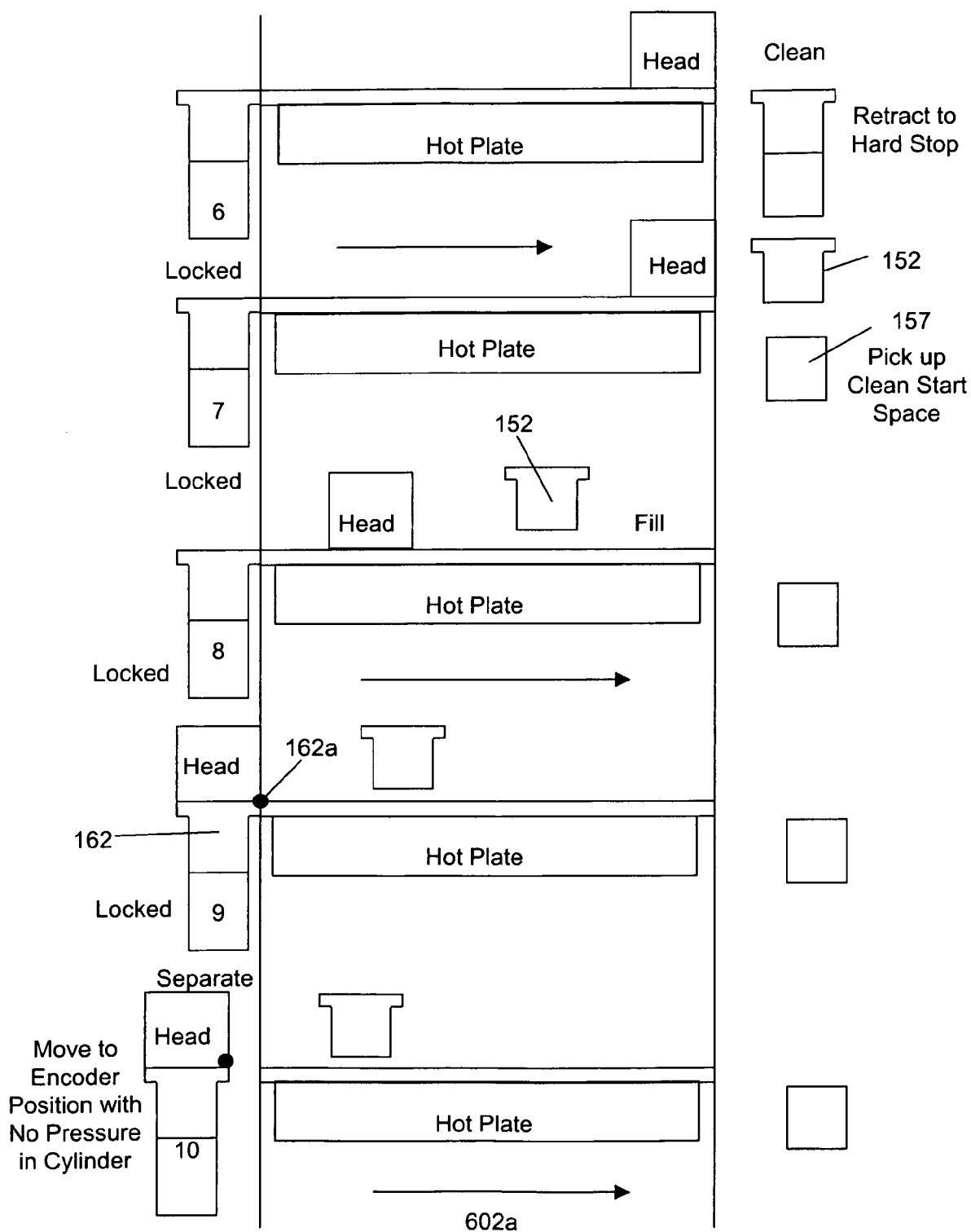
Figure 35:
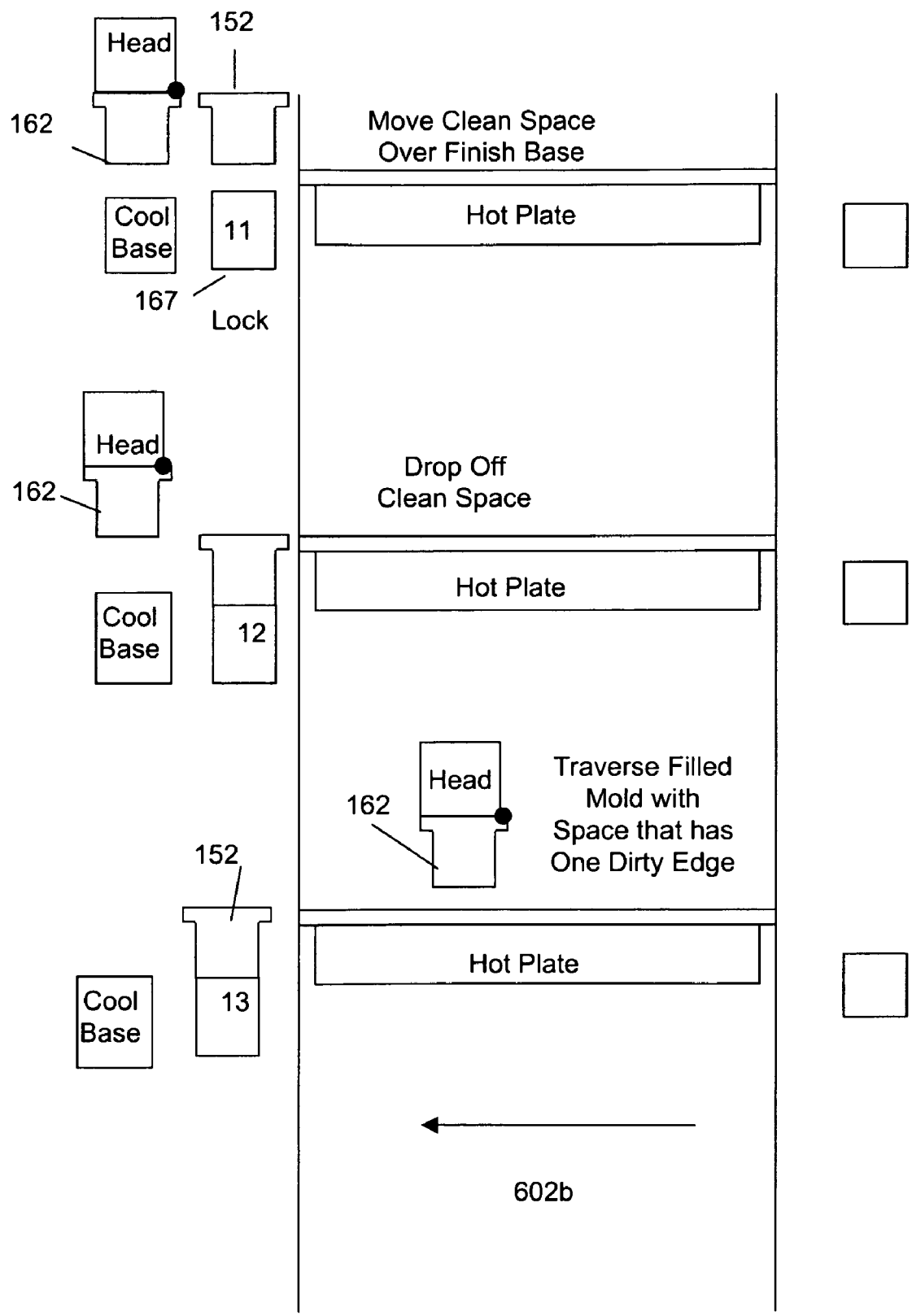
Figure 36:
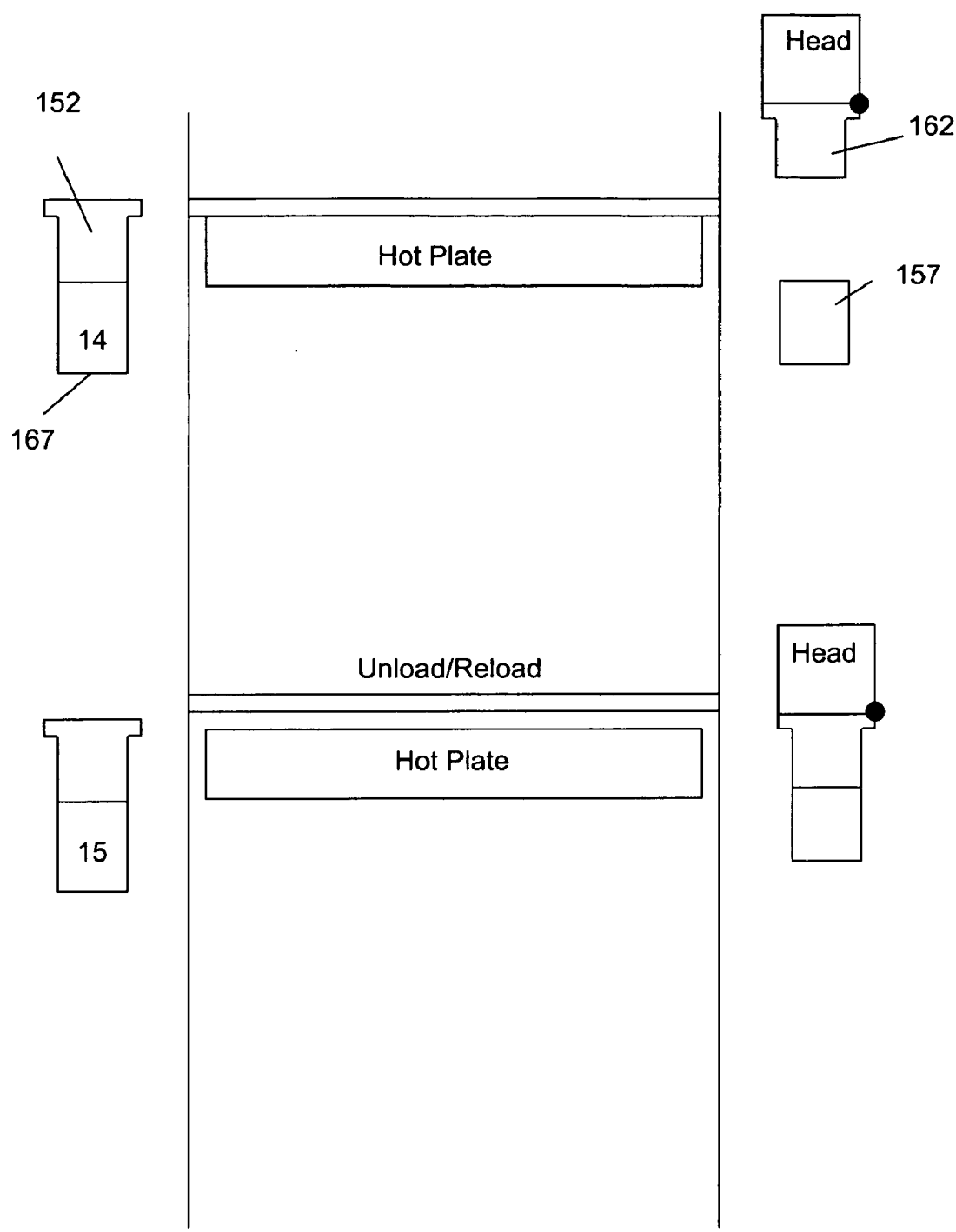
Figure 37:
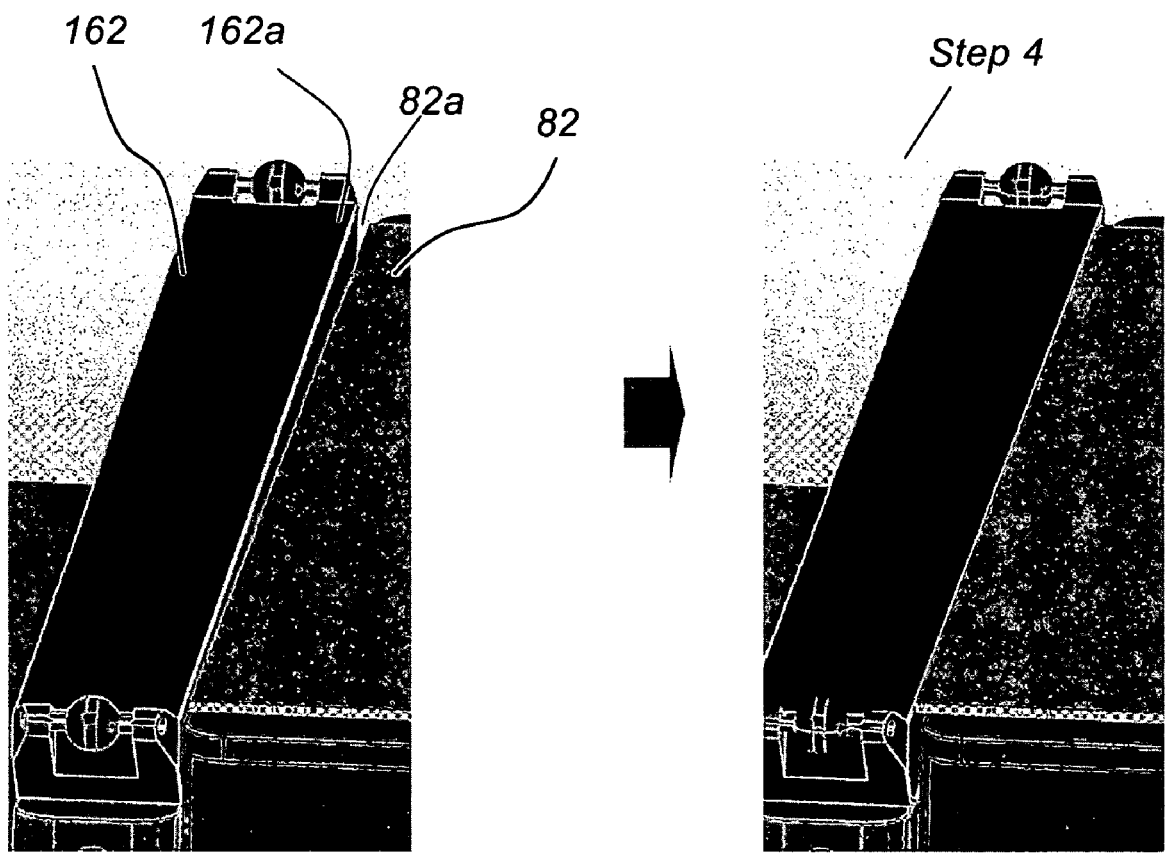
FIG. 37 illustrates the mold alignment process against the finish parking space.
Figure 38:
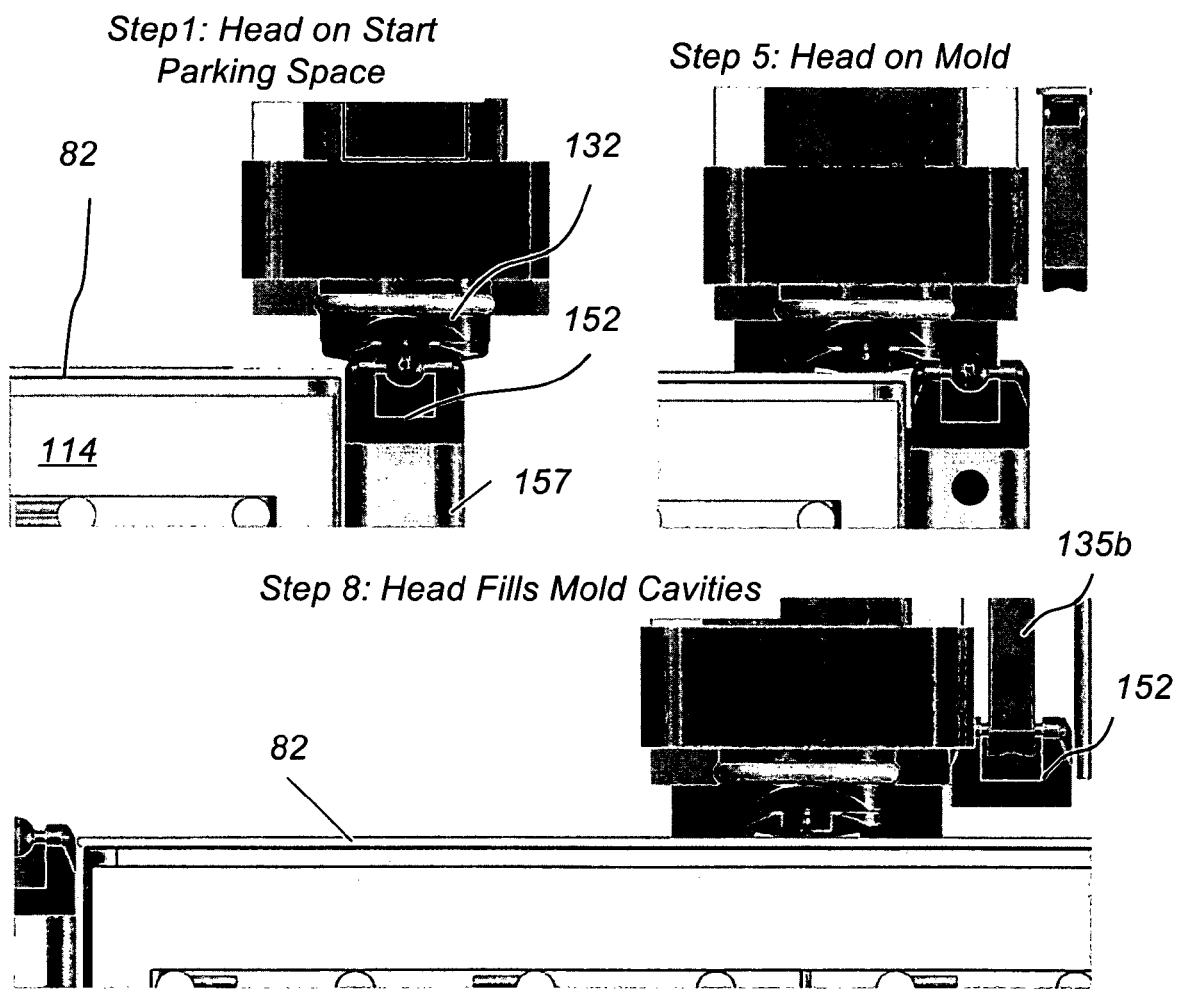
FIG. 38-FIG. 39 illustrate the process steps of scanning the hot plate under the injector head and the function of the start and finish parking spaces.
Figure 39:
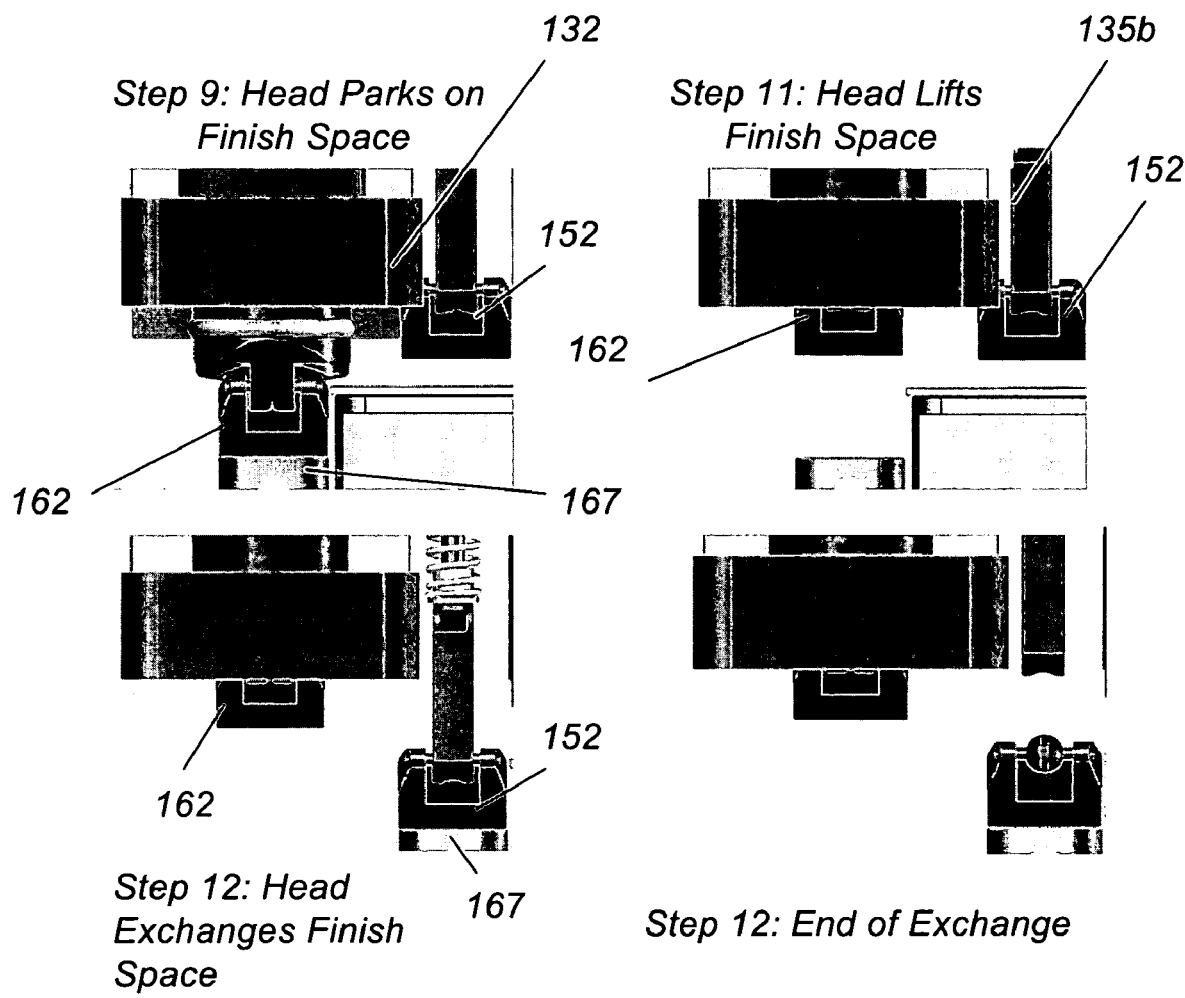

As was mentioned above, the hot plate carriage assembly 140 carrying the mold 82 on its top is scanned under the solder head assembly 130 in the direction of 602a for the mold filling process. The process of scanning the mold plate under the injector and the parking space mechanism is described with reference to FIG. 33-37. Initially the injector head 132 is positioned on the heated start parking space 152 and the mold 82 is loaded onto the hot plate 114 which is placed in the center of the carriage assembly 140 (step 1), as shown in FIG. 38. Edge 152a of the start parking space is shown in FIG. 33 to have some solder deposit from the previous run. Next, the support pins 172a-172c are lowered and the mold 82 is brought in contact with the hot plate 114 (step 2). The finish parking space 162 is then moved to the fixed stop 161b at low pressure (step 3) and then the edge 82a of the mold 82 is aligned with the finish parking space edge 162a, as shown in FIG. 37 (step 4). The start parking space 152 is also moved to the X-axis encoder position 161*a*. Next, the positions of the start parking space 152 and the finish parking space 162 are locked and the vacuum for holding the mold 82 onto the hot plate 114 is turned on to secure the aligned mold onto the hot plate 114 during scanning. The hot plate assembly 140 is scanned in the direction 602*a* so that the mold plate 82 is positioned under the stationary injector head 132, as shown in step 5 of FIG. 33 and FIG. 38. The transition of the injector head 132 from the start parking space 152 onto the mold plate 82 causes solder residue to be deposited onto edge 152*b* of the parking space 152, shown in FIG. 33. Next, the solder deposits from edges 152*a*, 152*b* of the start parking space 152 are cleaned at the cleaner assembly 136 (step 6) and then the clean start parking space 152 is picked up by the second lifter 135*b*, as shown in step 7 of FIG. 34 and FIG. 38. The mold 82 is scanned under the injector head 132 for filling of the mold cavities with solder while the start parking space 152 is carried by the second lifter 135*b*, as shown in FIG. 38 (step 8). When all cavities are filled the head 132 is at a position to be deposited onto the finish parking space 162, as shown in step 9 in FIG. 39. At this transition point, edge 162*a* of the finish parking base 162 is contaminated with solder deposit from the injector head 132. The head 132 is positioned onto the finish parking space 162 (step 9) and the mold/hot plate assembly separate from the finish parking space 162 (step 10). Next, the head 132 lifts up the finish parking space 162 (step 11) and the second lifter 135*b* places the clean start parking space 152 onto the finish base 167, as shown in FIG. 39 and FIG. 35 (step 12). Then the filled mold 82 is scanned under the injector head 132 carrying the finish parking space 162 in the opposite direction 602*b* (step 13) until it reaches the position where the injector head is above the start base 157 (step 14). At this point the injector head 132 deposits the finish parking base 162 onto the start base 157 (step 15), shown in FIG. 35. The filled mold is unloaded and an empty mold is loaded onto the hot plate and the process repeats again. Excess solder escaping from the injector head when the head is transferred from the mold onto and off the parking spaces is captured at the sides of hot plate 114 in the solder catchers 199, shown in FIG. 16.

Figure 32:
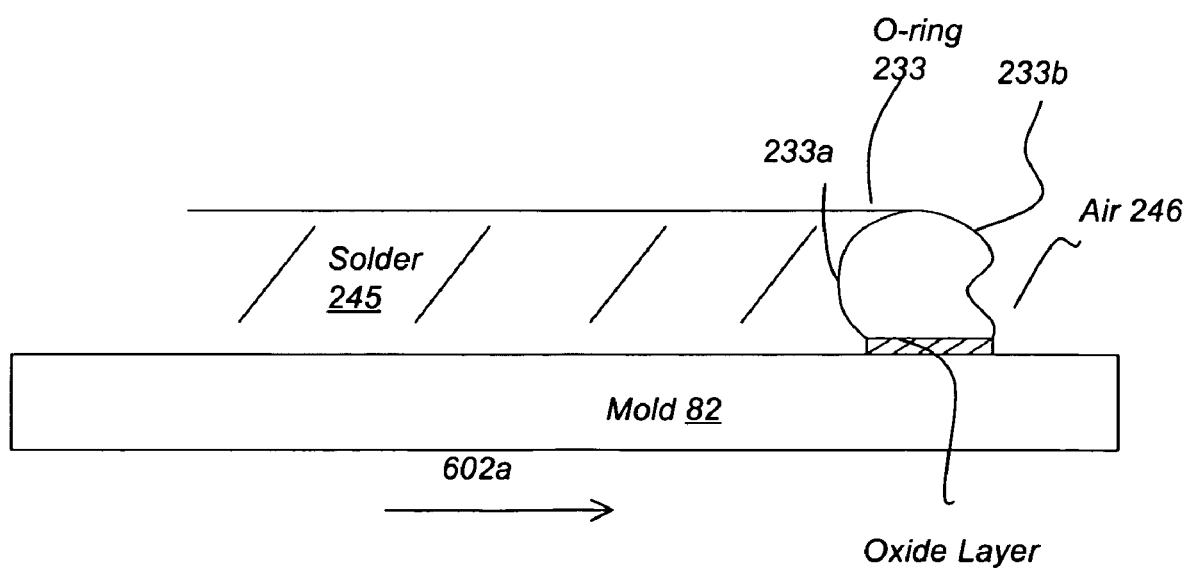
FIG. 32 is a cross-sectional view of the O-ring of FIG. 30.

Referring to FIG. 32, the HVM MFT is designed to fill the mold cavities when the mold 82 is scanned in the direction of 602*a* and to return the filled mold back in the starting position before repeating the filling process with a new mold. This one-way deposition ensures that edge 233*a* of the injector head O-ring 233 is always in contact with the molten solder 246 that is injected through the slot 234 and edge 233*b* is always in contact with the hot air mixture of air (or oxygen) and nitrogen 246. An oxide layer 248 is formed at the bottom surface of the O-ring and is always in contact with the mold surface, as shown in FIG. 32. This particular scanning limitation is important for the repeatability of the deposition parameters and reduction of defects.

Figure 40:
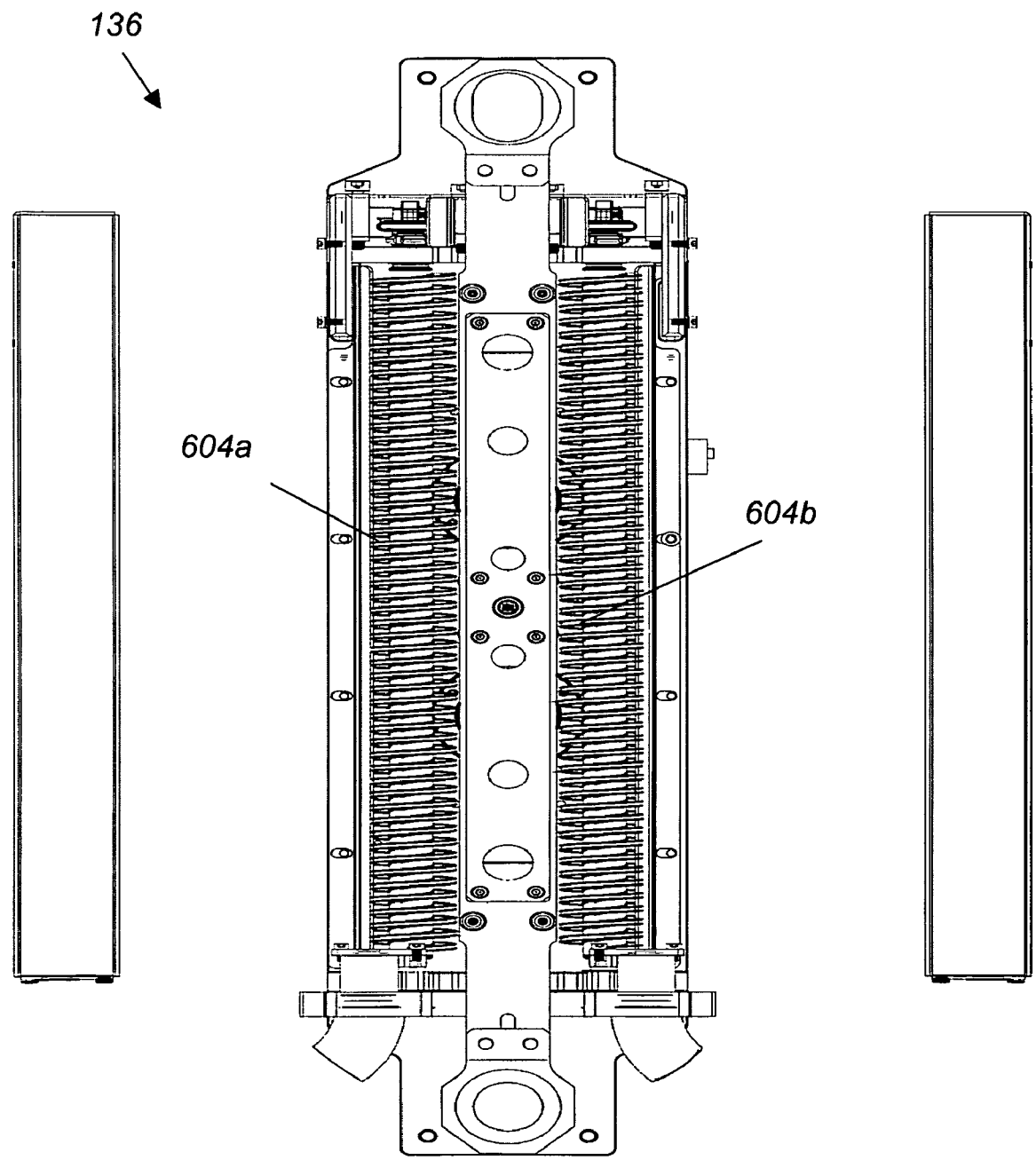
FIG. 40 depicts a bottom view of the cleaner assembly for the parking spaces.
Figure 42:
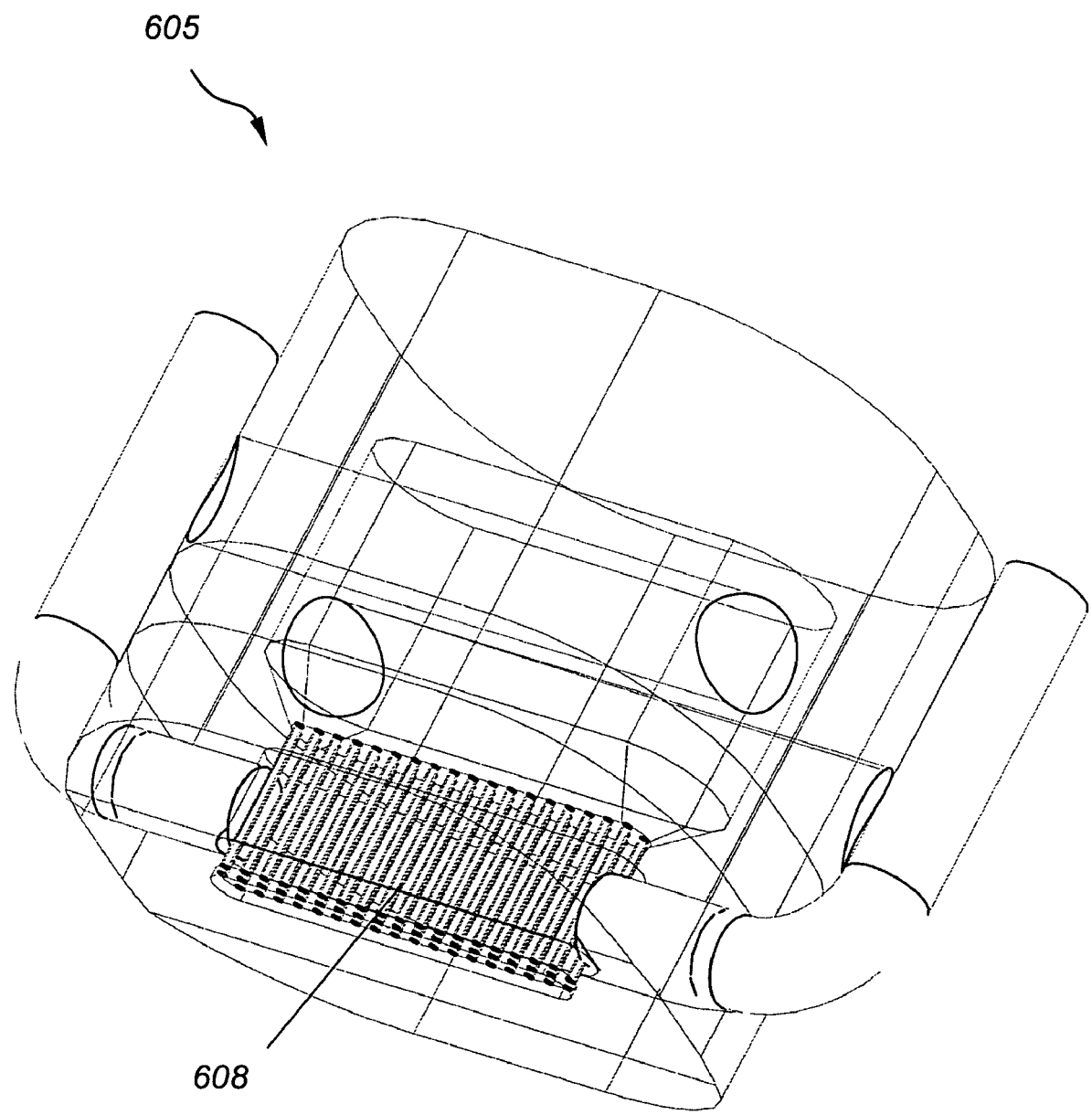
FIG. 42 is another embodiment for the injector head.

As was mentioned above, both parking spaces 152, 162 are heated to a temperature slightly above the melting point of the solder used for filling the mold cavities and the mold 82 floats above the hot plate 114 during the scanning process and is held in place by vacuum. Glass mold 82 is square shaped and the left edge of the square is aligned against the end parking space to correct for any dimensional imperfections of the mold that may lead to solder bump defect formation. In one example mold 82 is a square having a side of 14 inches long. There is a border around the square mold surface that does not carry any patterned cavities. The edges of the start and finish parking spaces 152, 162 that were contaminated with solder deposit during the mold fill process are cleaned at the cleaner assembly 136, shown in FIG. 40. Cleaner assembly 136 includes two rotating brushes 604*a*, 604*b*. An alternative injector head design that does not cause contamination of the parking space edges and mold edges is shown in FIG. 42. The injector head 605 includes capillaries 608 through which air is blown to "freeze off" the molten solder before lifting the injector head from the mold or parking space surfaces.

Problems with the injector head during the mold fill process include chatter, tipping and warping. Chatter is caused by small vibrations of the injector head and can lead to skipping along the glass mold and either not filling a cavity or partially filling a cavity. One way of reducing chatter is to hold down the injector head onto the glass mold by clamping the solder head assembly onto the glass mold and applying pressure. Tipping refers to small forward or backward tilting of the injector head and can also lead to partially filled cavities, non-uniform sized bumps and bridges. The above mentioned clamping and applying pressure solution addresses this problem, as well. Head warping is caused by thermal gradients along the length of the injector head and can cause the injector head side ends to bend up or down. One way of reducing head warping is by heating the injector cap separately and by adding separate heaters along the length of the injector heads. In one example, the head is furnished with evenly spaced holes carrying low wattage cartridge heaters and the head is slightly compressed onto the mold.

Figure 41:
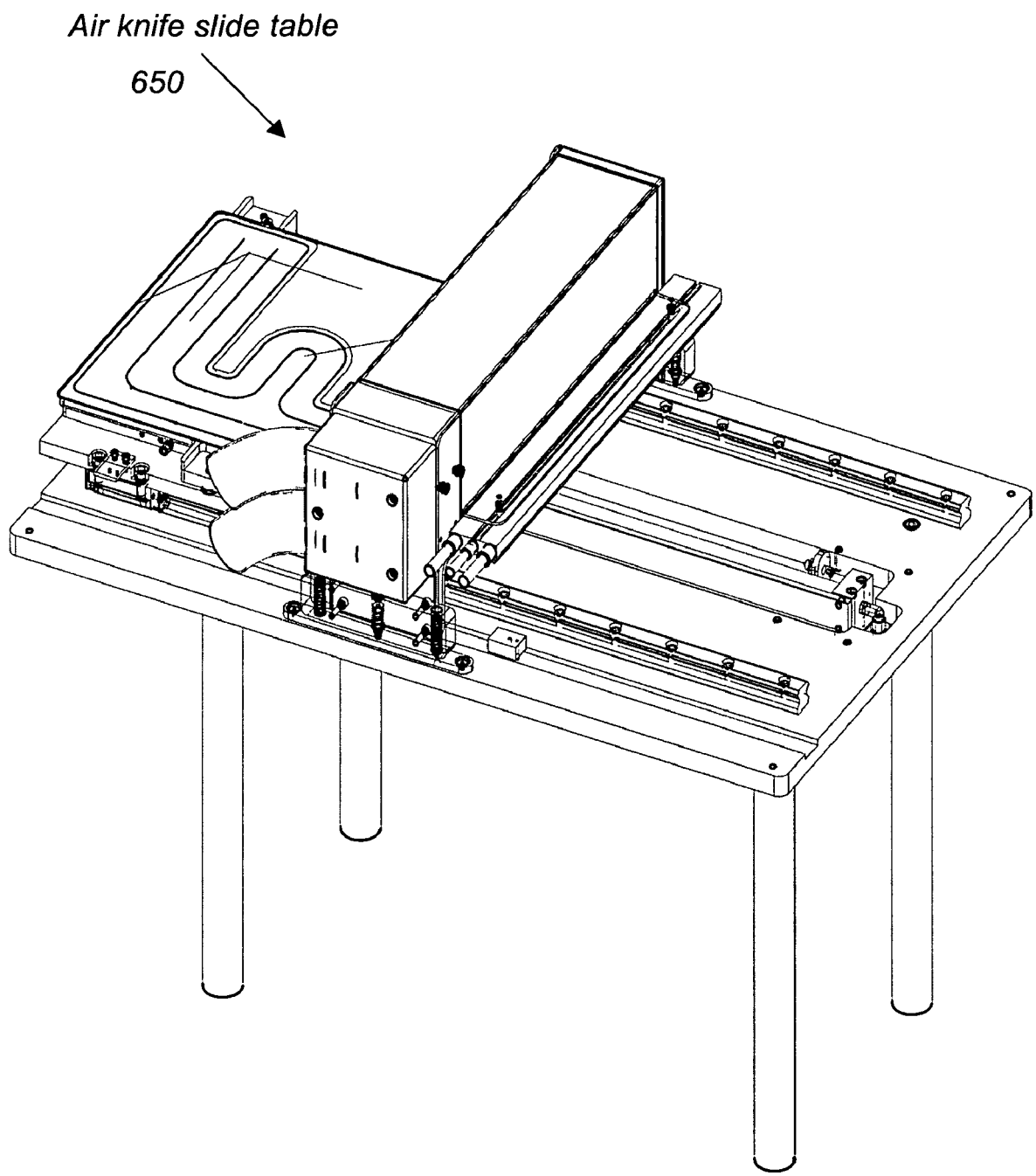
FIG. 41 depicts the air knife slide table.

Before the mold fill process the unfilled mold plates are cleaned at the air knife table 650, shown in FIG. 41. A combination of ultrasonic vibrations and blowing of ionized air is used to release and remove contaminants from the mold surface. The contaminates are removed by drawing a vacuum on the mold surface.

Several embodiments of the present invention have been described. Nevertheless, it will be understood that various modifications may be made without departing from the spirit and scope of the invention. Accordingly, other embodiments are within the scope of the following claims.

What is claimed is:

1. An apparatus for filling patterned mold cavities formed on a surface of a mold structure with solder comprising:
   an injector head assembly comprising a solder reservoir having a bottom surface with an elongated slot for injecting solder into said mold cavities;
   a carriage assembly configured to carry and scan said mold structure under said injector head assembly, wherein said carriage assembly comprises first and second parallel rails, a plate assembly movable upon said first and second parallel rails, a start parking space and a finish parking space and wherein said mold structure is placed upon said movable plate assembly for performing said scanning under said injector head assembly, and wherein each of said parking spaces comprises a parking plate having a V-groove on its bottom surface, a heated base supporting said parking plate, an insulator plate supporting said heated base, a back plate supporting said insulator plate and first and second leveling plates configured to level said back plate;
   a seal formed between an area of said solder reservoir bottom surface surrounding said elongated slot and said mold structure surface; and
   wherein said mold structure is brought into contact with said solder reservoir bottom surface, said seal is formed and then said mold cavities are filled with solder by scanning said mold structure under said injector head in a first direction from a starting position to a finish position while solder is injected into them and then said mold structure with the filled mold cavities is returned back to said starting position by scanning it in a second direction opposite to said first direction without any further solder injection.

2. The apparatus of claim 1 wherein said solder reservoir is heated to a temperature above said solder melting point and is slightly pressurized.

3. The apparatus of claim 2 further comprising a preheat station where said mold structure is preheated to a temperature slightly below said solder melting temperature prior to said scanning and filling of said mold cavities with solder.

4. The apparatus of claim 3 further comprising a cool down station where said mold structure is slowly cooled down to room temperature after said filling of said mold cavities with solder.

5. The apparatus of claim 2 further comprising an aligner for aligning said mold structure prior to said scanning and filling of said mold cavities with solder.

6. The apparatus of claim 2 wherein said injector head assembly remains stationary during said scanning in said first and second directions of said mold structure.

7. The apparatus of claim 1 wherein said plate assembly comprises a heated plate upon which mold structure is mounted, a non-heated back plate and an insulator plate placed between said heated plate and said back plate.

8. The apparatus of claim 7 wherein said mold structure is kinematically mounted onto said heated plate via three motorized pins and wherein said three motorized pins are arranged at 120 degree angle relative to each other and are used for lowering and raising said mold structure onto said heated plate.

9. The apparatus of claim 1 wherein said heated base and said heated plate upon which said mold structure is mounted are heated to a temperature slightly above said solder melting point.

10. The apparatus of claim 9 wherein said injector head assembly further comprises a hot gas skirt surrounding said solder reservoir bottom surface and being configured to blow hot gas onto it.

11. The apparatus of claim 10 wherein said injector head assembly further comprises an O-ring surrounding said elongated slot and forming said seal between an area of said solder reservoir bottom surface surrounding said elongated slot and said mold structure surface.

12. The apparatus of claim 11 wherein said O-ring comprises a material capable of withstanding said solder melt temperature.

13. The apparatus of claim 12 further comprising an injector head slide assembly and wherein said injector head assembly is supported and mounted onto said injector head slide assembly via a mounting mechanism that stabilizes said injector head assembly position while allowing for small thermal sidewise expansions, along the direction of the elongated slot.

14. The apparatus of claim 13 further comprising a support frame supporting said injector head slide assembly and first and second parking space lifters, wherein said first and second parking space lifters are configured to pick said start and finish parking plates, respectively and raise them up or lower them down onto said corresponding heated bases.

15. The apparatus of claim 14 further comprising a parking plate cleaner configured to clean said parking plates.

16. The apparatus of claim 15 wherein said injector head slide assembly comprises a material with low coefficient of thermal expansion.

17. The apparatus of claim 16 further comprising one or more thermocouples inserted into said solder reservoir at various heights and wherein said thermocouples produce thermocouple readings used to measure solder fill levels in said solder reservoir.

18. The apparatus of claim 12 wherein said injector head assembly further comprises capillaries through which air is blown toward said elongated slot for freezing any molten solder.

19. An apparatus for forming solder bumps onto semiconductor structures comprising:

equipment for filling patterned mold cavities formed on a surface of a mold structure with solder, said equipment comprising an injector head assembly comprising a solder reservoir having a bottom surface with an elongated slot for injecting solder into said mold cavities and a carriage assembly configured to carry and scan said mold structure under said injector head assembly, wherein said carriage assembly comprises first and second parallel rails, a plate assembly movable upon said first and second parallel rails, a start parking space and a finish parking space and wherein said mold structure is placed upon said movable plate assembly for performing said scanning under said injector head assembly, and wherein each of said parking spaces comprises a parking plate having a V-groove on its bottom surface, a heated base supporting said parking plate, an insulator plate supporting said heated base, a back plate supporting said insulator plate and first and second leveling plates configured to level said back plate; and wherein said mold structure is brought into contact with said solder reservoir bottom surface and said elongated slot and a seal is formed between an area of said solder reservoir bottom surface surrounding said elongated slot and said mold structure surface and then said mold cavities are filled with solder by scanning said mold structure under said injector head in a first direction from a starting position to a finish position while solder is injected into them and then said mold structure with the filled mold cavities is returned back to said starting position by scanning in a second direction opposite to said first direction without any further solder injection;

equipment for positioning and aligning a patterned first surface of a semiconductor structure directly opposite to said solder filled patterned mold cavities of the mold structure;

a fixture tool for holding and transferring said aligned mold and semiconductor structures together; and equipment for receiving said fixture tool with the aligned mold and semiconductor structures and transferring the solder from said aligned patterned mold cavities to said aligned patterned semiconductor first surface.

* * * * *